(12) United States Patent
Roy et al.

(10) Patent No.: US 9,489,618 B2
(45) Date of Patent: Nov. 8, 2016

(54) ELECTRONIC COMPARISON SYSTEMS

(71) Applicant: Purdue Research Foundation, West Lafayette, IN (US)

(72) Inventors: Kaushik Roy, West Lafayette, IN (US); Mrigank Sharad, West Lafayette, IN (US)

(73) Assignee: Purdue Research Foudation, West Lafayette, IN (US)

( * ) Notice: Subject to any disclaimer, the term of this patent is extended or adjusted under 35 U.S.C. 154(b) by 0 days.

(21) Appl. No.: 14/287,701

(22) Filed: May 27, 2014

(65) Prior Publication Data

US 2015/0347896 A1    Dec. 3, 2015

(51) Int. Cl.

| | | |
|---|---|---|
| *G06N 3/063* | (2006.01) | |
| *G11C 11/16* | (2006.01) | |
| *G11C 11/54* | (2006.01) | |
| *G11C 13/00* | (2006.01) | |
| *G11C 15/02* | (2006.01) | |
| *G11C 15/04* | (2006.01) | |
| *H03M 1/38* | (2006.01) | |

(52) U.S. Cl.
CPC .............. *G06N 3/063* (2013.01); *G11C 11/16* (2013.01); *G11C 11/54* (2013.01); *G11C 13/0007* (2013.01); *G11C 15/02* (2013.01); *G11C 15/046* (2013.01); *H03M 1/38* (2013.01)

(58) Field of Classification Search
CPC ... G11C 11/16; G11C 11/54; G11C 13/0007; G11C 15/02; G11C 15/046; G06N 3/063; H03M 1/38
USPC ........... 365/148, 66, 78, 80; 327/99; 706/33, 706/34, 35, 36, 37, 38, 41
See application file for complete search history.

(56) References Cited

U.S. PATENT DOCUMENTS

| | | | | |
|---|---|---|---|---|
| 3,638,196 A | * | 1/1972 | Nishiyama | G06F 7/023 192/113.1 |
| 5,165,009 A | * | 11/1992 | Watanabe | G06N 3/063 706/41 |
| 5,336,937 A | * | 8/1994 | Sridhar | G06N 3/0635 326/112 |
| 5,479,579 A | * | 12/1995 | Duong | G06N 3/0635 706/20 |
| 5,588,090 A | * | 12/1996 | Furuta | G06N 3/063 706/25 |
| 6,389,404 B1 | * | 5/2002 | Carson | G06N 3/063 706/18 |

(Continued)

OTHER PUBLICATIONS

Sharad et al., "Spin-Based Neuron Model with Domain-Wall Magnets as Synapse", 2012, IEEE, pp. 843-853.*

(Continued)

*Primary Examiner* — Sung Cho
(74) *Attorney, Agent, or Firm* — Lee & Hayes, PLLC; Christopher J. White

(57) ABSTRACT

An electronic comparison system includes input stages that successively provide bits of code words. One-shots connected to respective stages successively provide a first bit value until receiving a bit having a non-preferred value concurrently with an enable signal, and then provide a second, different bit value. An enable circuit provides the enable signal if at least one of the one-shots is providing the first bit value. A neural network system includes a crossbar with row and column electrodes and resistive memory elements at their intersections. A writing circuit stores weights in the elements. A signal source applies signals to the row electrodes. Comparators compare signals on the column electrodes to corresponding references using domain-wall neurons and store bit values in CMOS latches by comparison with a threshold.

20 Claims, 17 Drawing Sheets

(56) References Cited

U.S. PATENT DOCUMENTS

| | | | | |
|---|---|---|---|---|
| 6,844,582 | B2* | 1/2005 | Morita | G06N 3/0635 257/295 |
| 7,085,749 | B2* | 8/2006 | Matsugu | G06K 9/00973 327/355 |
| 7,577,020 | B2* | 8/2009 | Chung | G11C 11/16 365/148 |
| 8,923,040 | B2* | 12/2014 | Lin | G11C 11/1675 365/148 |
| 2004/0039717 | A1* | 2/2004 | Nugent | B82Y 10/00 706/27 |
| 2006/0123280 | A1* | 6/2006 | Tran | G11C 11/5621 714/718 |
| 2010/0238700 | A1* | 9/2010 | Li | G11C 11/16 365/148 |
| 2010/0241601 | A1* | 9/2010 | Carson | G06N 3/02 706/27 |
| 2013/0132314 | A1* | 5/2013 | Snider | G06N 3/063 706/15 |
| 2013/0285739 | A1* | 10/2013 | Blaquiere | G01R 31/31855 327/565 |
| 2014/0028347 | A1* | 1/2014 | Robinett | G11C 13/0007 326/38 |

OTHER PUBLICATIONS

Demosthenous, A. et al., "A CMOS Analog Winner-Take-All Network for Large-Scale Applications", IEEE Trans. on Fundamental Theory and Appl, 45(3), 300-304, 1998 (5 pgs.).

Andreas et al., A CMOS Analog Winner-Take-All Network for Large Scale Applications, IEEE TCAS 1998 (5 pgs.).

K. Kim et al., "A Functional Hybrid Memristor Crossbar-Array/CMOS System for Data Storage and Neuromorphic Applications", Nano Letters, 12.1, 389-395, 2011 (7 pgs.).

H. Manem et al., "A Read-Monitored Write Circuit for 1T1M Multi-Level Memristor Memories", ISCAS, 2938-2941, 2012 (4 pgs.).

Morris, D. et al., "mLogic: Ultra-Low Voltage Non-Volatile Logic Circuits Using STT-MTH Devices" DAC, 486-491, 2012 (6 pgs.).

M. Hu et al, "Hardware Realization of BSB Recall Function UsingMemristor Crossbar Arrays", DAC, 498-503, 2012 (6 pgs.).

C. Augustine et al., "Numerical analysis of domain wall propagation for dense memory array", IEDM, 17-6, 2011 (4 pgs.).

Fukami, S. et al., "Low-current perpendicular domain wall motion cell for scalable high-speed MRAM", VLSI Tech. Symp, 230-231, 2009 (2 pgs.).

Currivan, J. A. et al., "Low energy magnetic domain wall Logic in short, narrow ferromagnetic wires", IEEE Magnetics Letters, 3000104-3000104, 2012 (4 pgs.).

Ngo et al., "Direct Observation of Domain Wall Motion Induced by Low-Current Density in RbFeCo Wires", Applied Physics Express, 2011 (4 pgs.).

Lim, C. K., "Domain wall displacement induced by subnanosecond pulsed current", Appl. Phy. Lett., 84.15, 2820-2822, 2004 (4 pgs.).

L. Gao et al., Analog-Input Analog-Weight Dot-Product Operation with Ag/s-Si/Pt Memristive Devices, VLSISOC, 88-93, 2012 (6 pgs.).

Sharad, M. et al., "Ultra low power associative computing with spin neurons and resistive crossbar memory", ACM Design Automation Conference, 107, 2013 (6 pgs.).

Dlugosz, R. et al., "Low power current-mode binary-tree asynchronous Min/Max circuit,", Microelectronics Journal, 41.1, 64-73, 2009 (10 pgs.).

* cited by examiner

ELECTRONIC COMPARISON SYSTEMS

STATEMENT OF FEDERALLY SPONSORED RESEARCH OR DEVELOPMENT

This invention was made with Government support under Contract No. HR0011-13-3-0002 awarded by the Defense Advanced Research Projects Agency. The government has certain rights in the invention.

TECHNICAL FIELD

The present application relates to electronic systems, and particularly to such systems for performing comparisons of signals or data.

BACKGROUND

In recent years several device solutions have been proposed for fabricating nano-scale programmable resistive elements, generally categorized under the term "memristor." Of special interest are those which are amenable to integration with state of art CMOS technology, like memristors based on Ag—Si filaments. Such devices can be integrated into metallic crossbars to obtain high density resistive crossbar networks (RCN; also referred to as "resistive crossbar memory," RCM).

FIG. 1 is a perspective of an exemplary resistive crossbar network 100. It includes row electrodes 110 and column electrodes 120, e.g., metal bars fabricated on an integrated circuit. Memristors 130 (e.g., Ag—Si) are arranged at the intersections of row electrodes 110 and column electrodes 120. Any number of row electrodes 110, column electrodes 120, or memristors 110 can be used. For each row i and column j, the memristor 130 in row i, column j has conductivity $g_{ij}$, interconnecting the $i^{th}$ row electrode 110 and the $j^{th}$ column electrode 130. Multi-level write techniques known in the art for memristors can be used to store information in the memristors 130. In an example, 3% write accuracy (equivalent to 5-bits) is used for the memristors 130.

The substantially continuous range of resistance values obtainable in memristors 130 can facilitate the design of multi-level, non-volatile memory. The RCN technology permits combining memory with computation. RCNs can be used for a large number of non-Boolean computing applications that involve pattern-matching. Note that, the class of non-Boolean pattern-matching computations, a prospective application of RCN technology, is inherently approximate and have relaxed precision constraints. Such applications employ memory-intensive computing that can involve correlation of multidimensional input data with a large number of stored patterns or templates, in order to find the best match. Use of conventional digital processing techniques for such tasks incurs prohibitively high energy and real-estate costs, due to the number of computations involved. RCNs can be used for this class of associative computation. Owing to the direct use of nano-scale memory array for associative computing, RCNs can provide a very high degree of parallelism, and can reduce or eliminate the overhead due to memory reading.

Associative computing with RCNs is largely analog in nature, as it involves evaluating the degree of correlation between inputs and the stored data. As a result, many prior schemes for associative hardware using RCNs perform processing using, e.g., analog CMOS circuits or analog operational amplifiers (for current-mode processing). However, use of multiple analog blocks for large scale RCNs may lead to high static power consumption. This can eclipse the potential energy benefits of RCN for non-Boolean computing. Moreover, with technology scaling, the impact of process variations upon analog circuits becomes increasingly more prominent, resulting in lower resolution for signal amplification and processing. This limits scalability of analog approaches. Hence, the conventional analog circuits may fail to exploit the RCN technology for energy efficient, non-Boolean computing.

A prior scheme for finding data in an RCN correlated with a test input involves a digital or mixed-signal CMOS "winner-take-all" (WTA) circuit. The RCN provides correlation values between stored vectors and input data. The WTA is used to identify the maximum (or minimum) among a the correlation values. WTAs are used in some pattern matching applications to find the maximum (minimum) among the outputs of a distance-evaluation matrix.

FIG. 2 shows a prior mixed-signal CMOS winner-take-all (WTA) circuit fed by an RCN 210 to find the maximum of N inputs, each with m-bit precision. Memristors are labeled $g_{mn}$. Input stage 220 (details shown in the inset) buffers currents from the column lines of RCN 210 using regulated current mirrors. This provides low input-impedance and a near constant DC bias to the RCN 210. Exemplary known WTA circuits include current-conveyer WTA (CC-WTA), and binary tree WTA (BT-WTA), the later being more suitable for large number of inputs. BT-WTA employs a binary tree of 2-input comparison stages which involve copying and propagating the larger of the two current inputs to the output. Shown is BT-WTA tree 230.

Tree 230 includes approximately N pairwise comparators 240 ("WTA-2"; details shown in the inset). Schemes using digital rather than current comparisons require each comparator 240 be an m-bit comparator. Comparators 240 are arranged in a binary tree structure. Each comparator 240 computes the winner (larger or smaller) between two of its input and passes the larger (smaller) value to the next stage of nodes. With increasing number of inputs to the WTA, the numbers of stages and nodes in the binary WTA tree 230 increase, leading to larger delay and area. Therefore the area required increases steeply, and the time required also increases steeply.

In general, the use of such analog WTA circuits leads to large static power consumption. In fact, the power consumption of an analog WTA unit can be several times larger than the RCN itself. Moreover, the performance of such current-mirror based circuits is limited by random mismatches in the constituent transistors and other non-idealities, e.g., channel length modulation, that introduce mismatch in different current paths. In order to maintain a sufficiently high resolution, larger transistor dimensions (both length as well as width) and hence, larger cell area is needed. This is evident from some recent designs that used scaled technology but with long channel lengths. This leads to increased parasitic capacitances and thus lower operating frequency for a given static power. Higher frequency and resolution can be achieved at the cost of increased input currents and thus larger power consumption. Special techniques to enhance the precision of current mirrors have been proposed in literature, but they introduce significant overhead in terms of power consumption and area complexity. Voltage-mode processing can also be employed in an RCN; however, it can incur additional overhead due to current to voltage conversion and subsequent amplifications. This can incur larger mismatch, non-linearity and power consumption. Digital processing can also be used by placing analog-to-digital converters (ADCs) in the input stage 220, but a full tree 230 of m-bit digital comparators 240 is then required, at considerable cost in area. Accordingly, conventional mixed-signal CMOS design techniques may not be able to leverage the emerging nano-scale resistive memory technology for memory based computing.

There is, therefore, a need of an improved WTA circuit and improved ways of comparing and storing values.

BRIEF DESCRIPTION

According to an aspect of the invention, there is provided an electronic comparison system, comprising:

a) a plurality of input stages, each configured to successively provide bits of a respective code word, starting with a most-significant bit thereof;

b) a plurality of one-shots connected to respective ones of the input stages to successively receive the bits of the respective code words, wherein each one-shot is configured to successively provide a first bit value until receiving a bit having a non-preferred value concurrently with an enable signal, and then to provide a second, different bit value;

c) an enable circuit connected to the outputs of the one-shots and configured to provide the enable signal if at least one of the one-shots is providing the first bit value.

According to another aspect of the invention, there is provided A neural network system, comprising:

a) a crossbar array having a plurality of row electrodes, a plurality of column electrodes, and a plurality of resistive memory elements, each memory element directly connected to one of the row electrodes and one of the column electrodes;

b) a writing circuit configured to store selected weights in the resistive memory elements; and c) a signal source configured to apply a plurality of test electrical signals to respective ones of the row electrodes;

d) a reference source configured to provide one or more reference electrical signal(s); and e) a plurality of comparators, each configured to compare an electrical signal on a respective one of the column electrodes to a corresponding one of the reference electrical signal(s), wherein each comparator includes:

i) a domain-wall neuron connected to the respective column electrode and the reference source; and ii) a CMOS latch configured to compare an output of the domain-wall neuron with a selected threshold and store a bit value according to the result of the comparison.

Various embodiments advantageously provide comparison of signals with reduced power and die-area consumption. This can permit associative memories and neural networks to be used in a wider range of applications.

This brief description is intended only to provide a brief overview of subject matter disclosed herein according to one or more illustrative embodiments, and does not serve as a guide to interpreting the claims or to define or limit scope, which is defined only by the appended claims. This brief description is provided to introduce an illustrative selection of concepts in a simplified form that are further described below in the Detailed Description. This brief description is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

Figure 1:
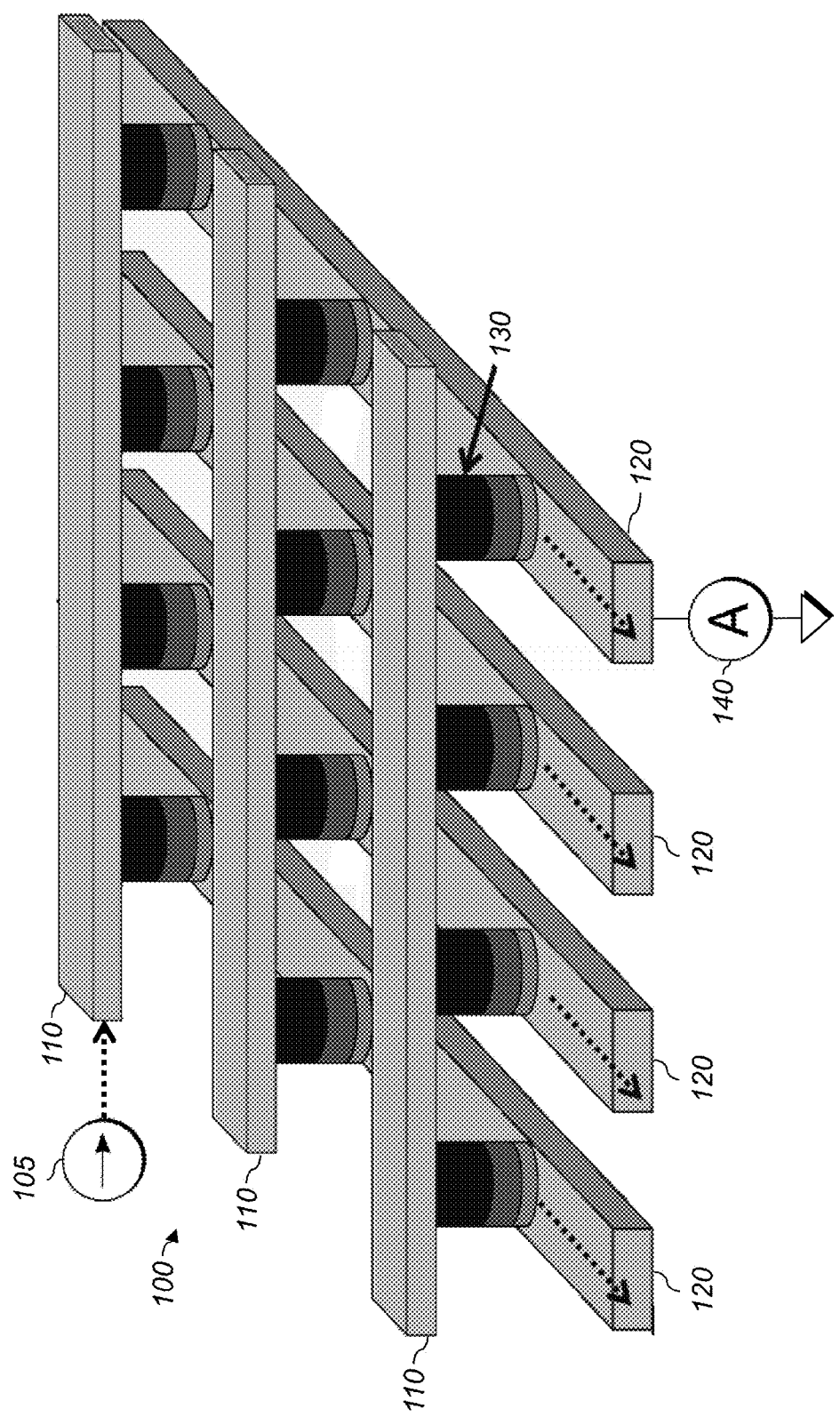
FIG. 1 is a perspective of an exemplary resistive crossbar network.
Figure 2:
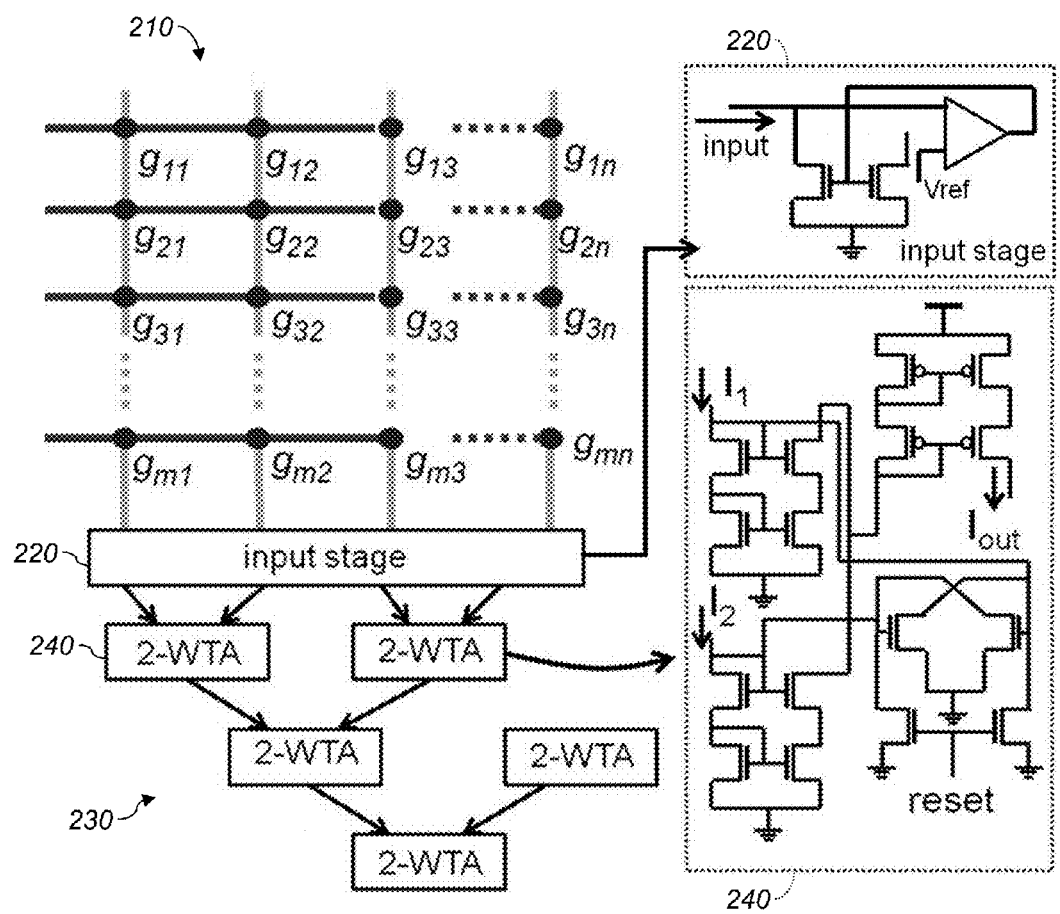
FIG. 2 is a schematic of a comparative winner-take-all circuit and related components.

The attached drawings are for purposes of illustration and are not necessarily to scale.

DETAILED DESCRIPTION

Throughout this description, some aspects are described in terms that would ordinarily be implemented as software programs. Those skilled in the art will readily recognize that the equivalent of such software can also be constructed in hardware, firmware, or micro-code. Because data-manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Various aspects use low-voltage, fast-switching, magneto-metallic 'spin-neurons' for ultra low-power non-Boolean computing with resistive crossbar networks (RCNs). Herein is described, e.g., the design of analog associative memory for face recognition using an RCN. Substituting conventional analog circuits with spin-neurons according to various aspects can achieve ~100× lower power than an analog RCN+WTA system. Various aspects are ~1000× more energy-efficient than a 45 nm-CMOS digital ASIC. These improvements can significantly expand the realm of applications of RCN-based computational hardware.

Referring back to FIG. 1, resistive crossbar network (RCN) 100 can be used for, e.g., computing analog-mode correlations or dot product values between input vectors and stored data patterns in the RCN, or otherwise evaluating correlation between inputs and stored data. Memory based pattern-matching applications generally apply some form of feature reduction technique to extract and store only 'patterns' or 'features' corresponding to different data samples. The extracted patterns can be represented in the form of analog vectors that can be stored in the memristors 130 along individual columns of the RCN shown in FIG. 1. In order to compute the correlation between an input and the stored patterns, input voltages $V_i$ (or currents $I_i$) corresponding to the input feature can be applied to the row electrodes 120.

When input voltages or currents are applied to one or more of the row electrodes 110, e.g., when currents are applied by current source 105, current flows in each column electrode 120, as represented graphically by the dotted arrows. Each column electrode 120 can be connected to a readout circuit. An exemplary readout circuit is shown connected to the rightmost column electrode 120 and includes ammeter 140 connecting that column electrode 120 to ground (or another voltage reference). The current measured by ammeter 140, into or out of column electrode 120 or, in general, the $j_{th}$ column electrode 120, can be visualized as the dot product of the inputs $V_i$ and the cross-bar conductance values $g_{ij}$. Hence, an RCN can directly evaluate correlation between an analog input vector and a number of stored patterns. This technique can be exploited in evaluating the degree of match (DOM) between an input and the stored patterns, the best match being the pattern corresponding to the highest magnitude of correlation $\Sigma_i V_i g_{ij}$.

In each column, the analog vector of a pattern is stored in the resistive memories. To compare an analog test vector to each pattern, successive elements of the test vector are applied to successive ones of the row electrodes 110. Each column electrode 120 will then carry an analog representation of the dot product of the test vector with the corresponding elements of the pattern stored in the memristors 130 connected to that column electrode 120.

As noted above, WTA circuits can be connected to the outputs of RCN 100 to determine which column electrode 120 is carrying a signal indicative of the highest (lowest) correlation. Conventional WTA circuits can be very expensive in area, time, and power consumption. Various aspects herein overcome these limitations using non-CMOS device technologies that can provide a better fit for the required non-Boolean, analog functionality, as compared to CMOS switches. These device technologies can be CMOS compatible.

Figure 3:
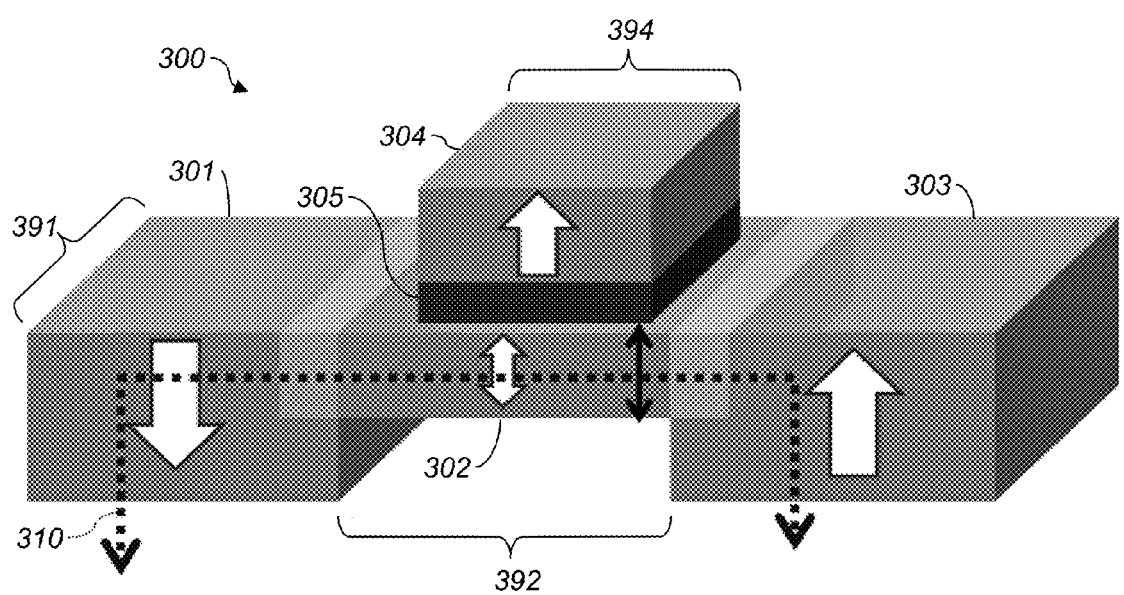
FIG. 3 is a perspective of an exemplary domain-wall neuron (DWN) according to various aspects.

FIG. 3 shows an exemplary device structure for a "spin neuron" 300 based on a domain wall magnet (DWM), referred to herein as a domain wall neuron (DWN). A domain wall magnet (DWM) includes multiple nano-magnet domains 301, 302, 303 separated by transition-boundaries called domain walls (DWs). DWs can be moved along a magnetic nano-strip using current-injection. Hence, the spin polarity of the DWM strip at a given location (e.g., in domain 302) can be switched, depending upon the polarity of its adjacent domains and the direction of electron flow. Recent experiments have achieved switching current-density of $\sim 10^6$ A/cm$^2$ for nano-scale DWM strips, and a switching time of less than 1 ns. The current threshold and the switching time of DWM can scale down with device-dimensions. DWMs with perpendicular magnetic anisotropy (PMA) are used in various aspects to achieve simultaneous scaling and low switching current-density. Spin-orbital coupling can be applied in various aspects to further reduce the switching currents for PMA DWMs. Such spin-torque phenomena can be used to provide nano-scale DWM switches which can be switched with current of the order of ~1 µA. Such low-resistance, low-current magneto-metallic switches can operate with small terminal voltages and can be suitable for analog-mode, non-Boolean computing applications. DWM-based current-mode switches can be used, e.g., in neuromorphic computing.

Spin neuron 300 is a domain-wall neuron (DWN) including a thin and short (e.g., 20×60×3 nm$^3$) nano-magnet domain 302 connecting two anti-parallel nano-magnet domains of fixed polarity, domain 301 and domain 303. Domain 301 forms the input port, whereas, domain 303 is grounded. In general, input electron current enters the device 300 through domain 301 and exits through domain 302, or vice versa. Spin-polarity of the DWM free-layer (domain 302) can be written parallel to domain 301 or domain 303 by injecting a small electron current along domain 302 from domain 301 to domain 303 or domain 303 to domain 301, respectively. Thus, the DWN can detect the polarity of the current flow at its input node. Hence it acts as a low voltage and compact current-comparator that can be employed in energy efficient current-mode data processing. Dimension 394 can be, e.g., 40 nm. Dimension 392 can be, e.g., 60 nm. Dimension 391 can be, e.g., 20 nm.

A magnetic tunnel junction (MTJ) formed between a fixed polarity magnet 304 and domain 302 is used to read the state of domain 302. The effective resistance of the MTJ is smaller when domain 304 and domain 302 have the same spin-polarity ($R_{parallel}$~5 kΩ) and larger when domains 302, 304 have opposite spin polarity ($R_{anti-parallel}$~15 kΩ).

A spin device operates as a compact current-mode comparator. The magnetic spin states are identified by up or down arrows. Up and down are stable. Domains 301, 303 have fixed, opposite spins, in this example down in domain 301 and up in domain 302. Domain 302 is free and can have either spin. If electrons are injected into domain 301 and a path exists through domain 302 and domain 303 and then out of the device, electrons flow along that path. Those electrons acquire a spin of domain 301 and carry that spin into domain 302, so domain 302 switches to have spin parallel to the spin of domain 301. This is because a fixed magnetic domain acts as a spin polarizer. Similarly, for electron current flow from domain 303 through domain 302 to domain 301, domain 302 changes to have spin parallel to domain 303. The resistance of the write path can be, e.g., ~100Ω.

To detect the state of domain 302, detection magnetic domain 304 is used. Domain 304 has fixed spin, in this example up. Tunneling barrier 305, e.g., an oxide barrier, separates domain 302 and domain 304 so they form a magnetic tunnel junction (MTJ). The resistance to current flow across barrier 305 is lower when domain 302 and domain 304 have same spin direction than when they have opposite spin directions, e.g., by a factor of 2×-3×.

In an example, current is injected into domain 304 and the current out of domain 303 (or domain 301) is measured to determine the spin state of domain 302. The current is small enough that it does not disturb domain 302 out of equilibrium. For reading, current can be passed through domains 302, 304 in either direction.

Robustness to read disturb can be improved by the appropriate design choice of ml. Notably, the branch with effective lower resistance draws comparatively higher read current ($I_{high}$). By setting the polarity of domain 304 parallel to domain 303, for the parallel configuration of the DWN MTJ (and hence lower resistance) the free layer (domain 302) is already parallel to domain 303 and hence a larger transient current does not disturb domain 302. This technique facilitates lowering of DWN threshold to physical limits without reduced concern of read-disturb. Apart from device scaling, the DWN threshold can also be lowered by manipulating other device parameters, like the anisotropy energy (Eb) of the magnet, or the use of spin-orbital coupling in the form of Spin Hall Effect or Rashba coupling.

In various aspects, current-driven heating in the magneto-metallic spin-neuron 300, and particularly in the thin and short central free domain 302 of the device, is reduced by increasing contact area of the two fixed domains 301, 303, or by shortening the free domain 302. In various aspects, the maximum current input through spin neuron 300 is below 40 µA.

Recent experiments on spin-torque devices have demonstrated high-speed switching of scaled nano-magnets with small currents. Such magneto-metallic devices can operate at low terminal voltages and can implement current-mode summation and comparison operations, at low energy cost. Such current-mode spin switches or 'neurons,' e.g., spin neuron 300, can be exploited in energy efficient analog-mode computing. Herein is presented a design of RCN based associative memory using such "spin neurons". In various aspects, the spin neurons form the core of hybrid processing elements (PE) that are employed in RCN based associative modules and can achieve two orders of magnitude lower computation energy as compared to conventional mixed-signal (MS) CMOS circuits. Application of spin neurons to RCN is useful as a non-Boolean computation tool. Further details of RCNs with DWNs are given below with reference to FIG. 6.

Figure 4:
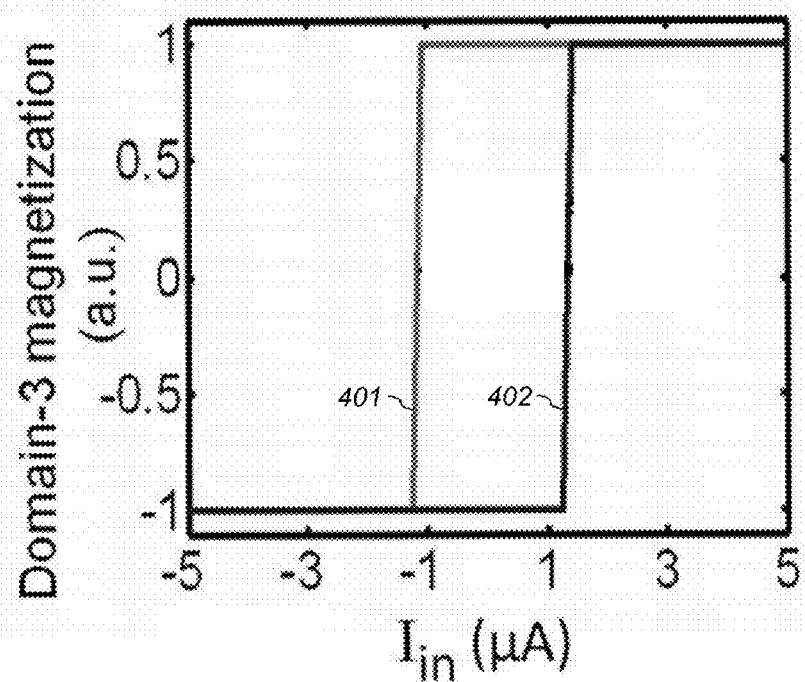
FIG. 4 is a plot of simulated DWN transfer characteristics.

FIG. 4 shows exemplary DWN transfer characteristics for Eb=20KT, exhibiting a non-zero current threshold for DW motion. The illustrated curves were simulated using models that were calibrated with experimental data. As shown, the non-zero current threshold results in a small hysteresis in the DWN switching characteristics (curve 401 vs. curve 402). Various aspects reduce the threshold to get closer to the step transfer function of an ideal comparator. Note that a DWN-based neuron employs a homogenous magnetic write-path and hence does not suffer from non-idealities like interface and channel-spin scattering that limit spin-injection efficiencies in devices based on lateral spin valves.

Figure 5:
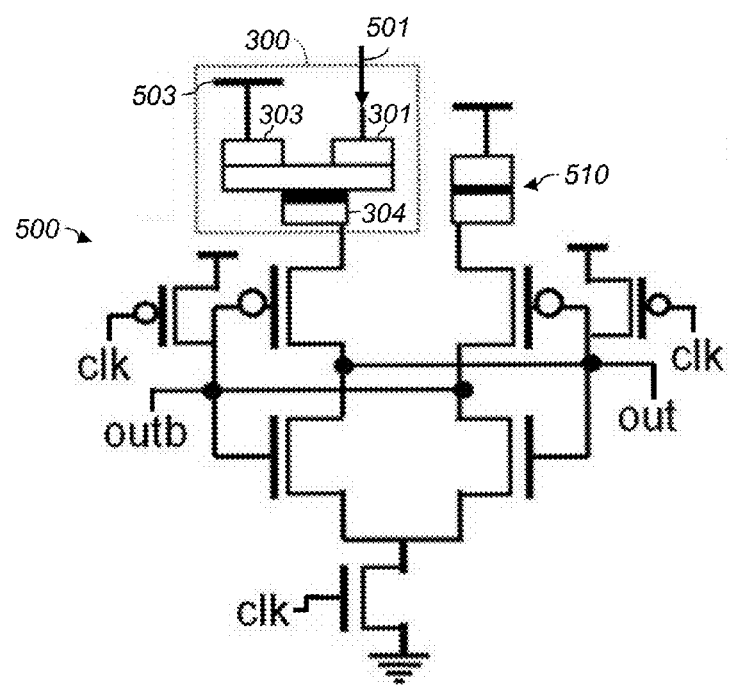
FIG. 5 is a schematic of an exemplary DWN and an exemplary dynamic CMOS latch connected thereto.

FIG. 5 shows an exemplary dynamic CMOS latch 500 used to detect the state of domain 302 (FIG. 3) in spin neuron 300. This latch illustrates a circuit technique employed to interface the domain wall neuron (DWN) with purely digital CMOS logic. Spin neuron 300 has domain 301 connected to input terminal 501 carrying an electrical signal (current or voltage) to be tested and domain 303 connected to a voltage reference 503, e.g., Vdd. The roles of domains 301, 303 can be interchanged.

An electrical signal is applied across input 501 and reference 503 to set the state of the spin neuron 300. E.g., a fixed current from a current source can be applied to domain 301, and a source/sink (e.g., GND) can be connected to reference 503. The state of domain 302 will be set to that of domain 301 for electron current into domain 301, and to that of domain 303 for electron current out of domain 301 (i.e., from reference 503 into domain 303).

To read the state of the MTJ, one of the load branches of latch 500 is connected to the MTJ region 304 of spin neuron 300. The other load branch is connected to a reference MTJ 510 whose resistance is midway between the up-spin and down-spin resistances of the MTJ in the spin neuron 300. The latch 500 compares the resistance between its two load branches through transient discharge currents. In an example using Vdd as the reference, after setting the state of domain 302, the transient evaluation current is applied and flows from domain 303 to domain 302. The current required for the DW motion increases proportional to the switching speed. Since the transient read current flows only for a short duration, it does not disturb the state of domain 302. This advantageously converts the two resistance states into conventional CMOS logic levels on the "out" and "outb" nodes, and permits synchronizing changes in those levels with a logic clock ("clk").

Similar spin-device structures with CMOS have been used for memory applications. However, such devices have larger energy barriers, threshold currents, and dimensions. Using a separate memory element advantageously permits scaling latch 500 and spin neuron 300, providing significant power and area savings in analog-mode non-Boolean computing.

Figure 6:
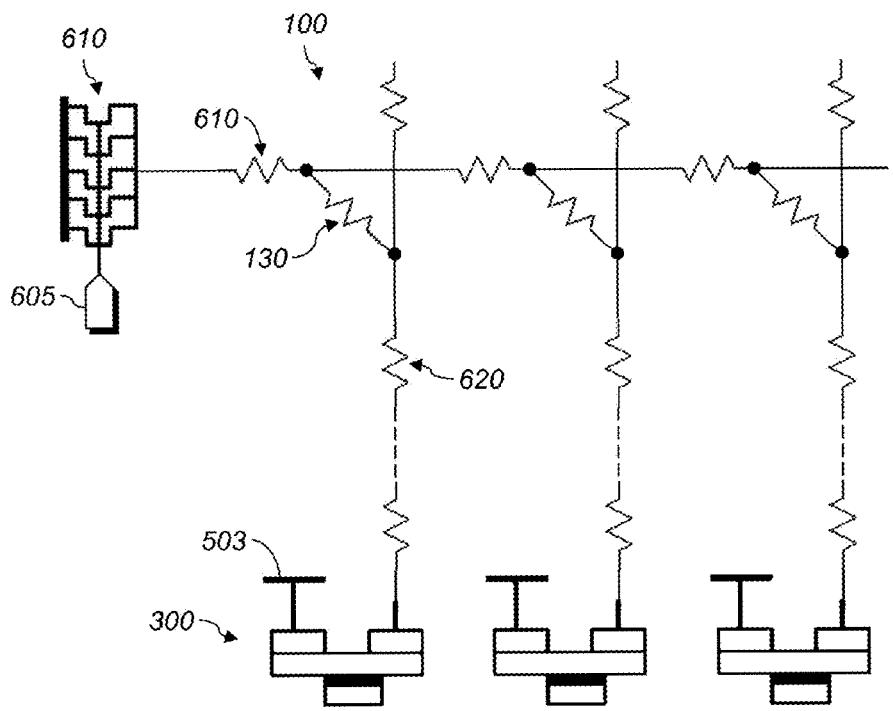
FIG. 6 is a perspective of an exemplary resistive crossbar network and associated components.

FIG. 6 shows an exemplary RCN 100. For clarity, only a single input and three outputs are shown. A digital value, e.g., a 5-bit value, is input on port 605. Other bit widths can also be used. DAC 610 provides a current signal correlated with the value from port 605. In the example shown, the low voltage operation of DWNs permits using a compact and energy efficient current-mode DAC 610 using binary weighted deep-triode current source (DTCS) PMOS transistors. A DC supply of V+ΔV is applied to the source terminals of the DTCS, where ΔV is ~30 mV. Ignoring the parasitic resistance of the metal crossbar, the drain to source voltage of the DTCS-DAC can be approximated to ΔV. The current $I_{in}(i)$, supplied by the $i_{th}$ DAC can thus be written as $\Delta V \cdot G_T(i) G_{TS}/(G_T(G_T(i)+G_{TS}))$, where G0 is the data dependent conductance of the $i_{th}$ DAC and $G_{TS}$ is the total conductance (of all the Ag—Si memristors, including the ON resistance of the access transistors, if present) connected to a horizontal bar (dummy memristors can be added for each horizontal input bar such that $G_{TS}$ is equal for all horizontal bars).

The input digital value can have any selected bit depth. Any type of DAC 610, voltage or current, can be used. In various aspects, since associative computing can be approximate in nature, a lower bit depth of the DAC can be used, or wider process variation permitted, than in prior schemes using non-associative comparison. Multiple rows are present, each driven by one DAC; the other rows are omitted for clarity. Memristors 130 connect row electrodes and column electrodes. Therefore the columns carry the dot products, as noted in FIG. 1, as the current flowing out of each column. Resistors 610 represent the parasitic resistances of the row electrodes 110 (FIG. 1) and resistors 620 represent the parasitic resistances of the column electrodes 120 (FIG. 1).

Three spin neurons (DWNs) 300 are shown with their input (domain 301 terminals) connected to respective column lines of the RCN 100. A DC voltage, V, is applied to the domain 303 terminals of all the DWNs (access transistors are not shown for simplicity). Owing to the small resistance of the DWN devices, this effectively biases output ends of the RCN (connected to domain 301 terminals) to the same voltage. Each spin neuron 300 acts as a current-mode comparator. This is further discussed below with reference to FIG. 13.

As a result, the current input through a memristor connecting the $i_{th}$ input bar to the $j_{th}$, output bar (in-plane) can be written as $I(i,j)=\Delta V \cdot G_T(i)G_{ST}/(G_T(i)+G_{ST})(G(i,j)/G_{ST})$, where, $G(i,j)$ is the programmed conductance of the memristor. For improved dot-product evaluation, the current $I(i,j)$ can be proportional to the product of $G_T$ (i.e., the DTCS conductance, proportional to the input data) and $G(i,j)$.

In various aspects, voltage signals are applied to the row electrodes 110 instead of currents. The applied voltage signals, e.g., the sources of drive transistors, can be connected to a voltage reference. The voltage reference can be selected with respect to the voltage on reference 503 of the DWNs 300 so that appropriate currents will be developed across memristors 130 and latched by latch circuits 500 (FIG. 5).

Figure 7:
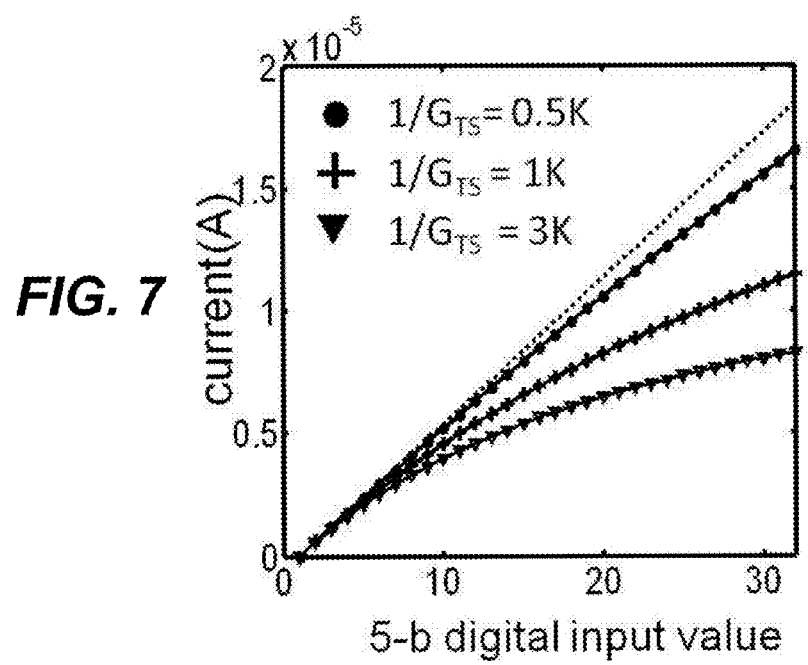
FIG. 7 is a plot of simulated characteristic curves of the circuitry shown in FIG. 6 according to various aspects.

FIG. 7 shows simulated non-linear characterisitics of DTCS DAC 610 resulting due to series combination with Gs. A low value of $G_{TS}$ (i.e. higher resistance values of the memristors) can introduce non-linearity in the DTCS-DAC characteristics. In various aspects, low values of $G_{TS}$ are used.

Figure 8:
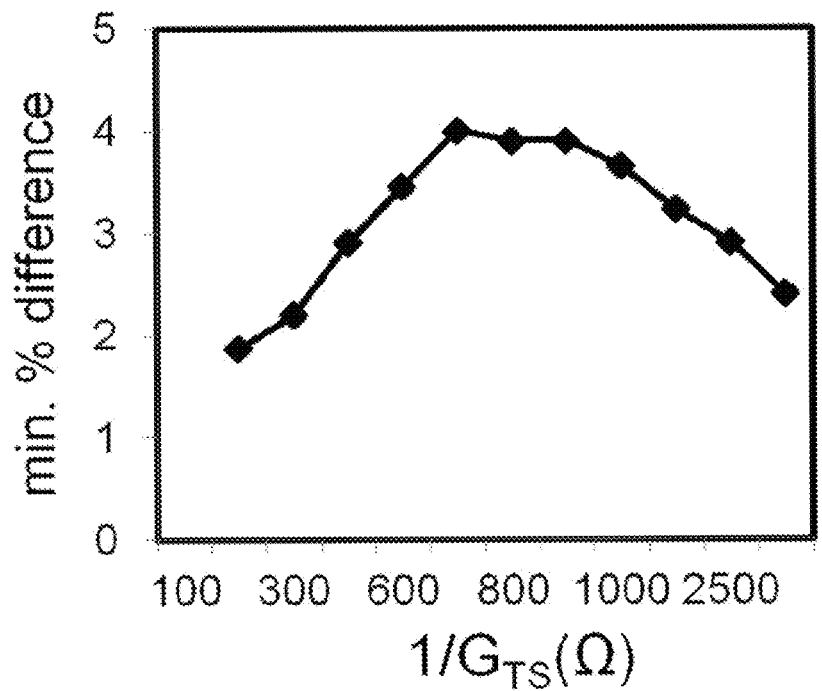
FIGS. 8 and 9 are simulated plots of changes in detection margin for the circuitry shown in FIG. 6 according to various aspects.

FIG. 8 shows simulation results useful for selecting values of $G_{TS}$ to achieve a selected detection margin for a given input in view of non-linearity (for low $G_{TS}$) and parasitic voltage drops (for high $G_{TS}$). Variation in $G_{TS}$ can lead to reduction in the detection margins (difference between the best and the second best match) for the current-mode dot product outputs for different input images. As a result, the overall matching accuracy of the network can be selected for a given WTA resolution.

Figure 9:
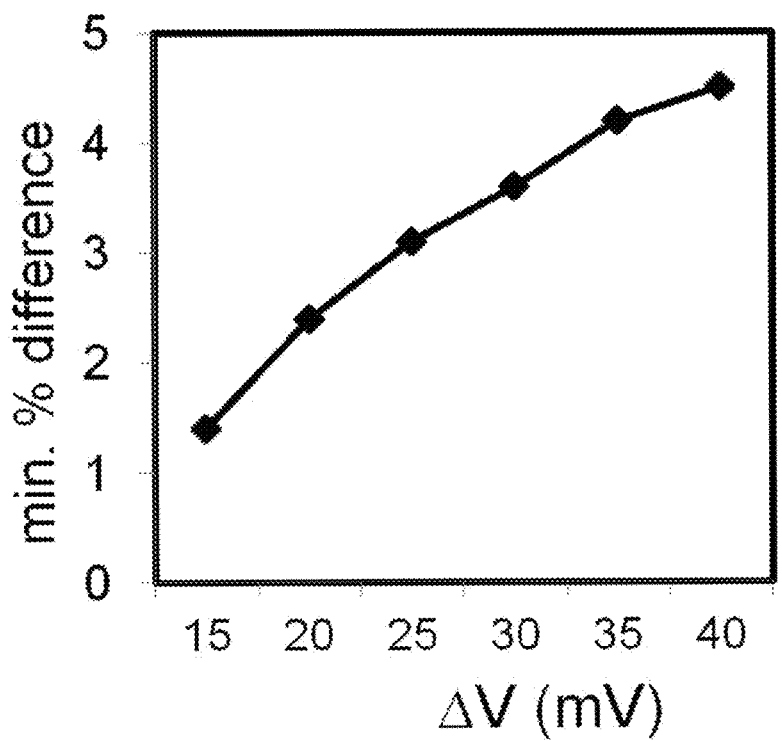

FIG. 9 shows simulation results indicating degradation in detection margin for a given input due to parasitic voltage drops. Accordingly, it is desirable to reduce $\Delta V$. Choosing a low range of values for the memristor resistances (e.g., 200Ω-6.4 kΩ, since no access transistor is used) would largely overcome the non-linearity shown in FIG. 9. However, for higher $G(i,j)$, voltage drop in the metal lines due to parasitic resistances 610, 620 (FIG. 6) can result in corruption of the current signals and degradation in the detection-margin. Accordingly, a range for the conductance values can be selected based on the achievable read margin, as shown in FIG. 8.

The range of current output from the DTCS-DAC needed can be selected based on the choice of WTA resolution. If the DWNs are designed to have a threshold of ~1 μA, the maximum value of the dot-product output must be greater than 32 μA for a 5 bit resolution for the WTA. This in turn, translates to the required range of DAC output current. For 128-element input vectors and 5-bit resolution for the WTA, the maximum value for DAC output required can be ~10 μA. This range of current can be obtained using different combination of DTCS sizing and the terminal voltage, $\Delta V$. For a required amount of DAC current, $\Delta V$ can be reduced to reduce the static power consumption in the RCN. The minimum value of $\Delta V$ is limited mainly by the parasitic voltage drops that degrade the detection margin and hence the matching accuracy. For an exemplary simulated design (RCN of size 128×40), a $\Delta V$ of 30 mV was found to be enough to preserve acceptable matching accuracy. Various aspects effectively bias the RCN across a small terminal voltage ($\Delta V$), thereby ensures that the static current flow in RCN takes place across a small terminal voltage of ~30 mV (between two DC supplies V and V+$\Delta V$). As noted above, the application of DWN in the RCN offers the benefit of low voltage operation and reduces the static power consumption in a current-mode, analog computing mode.

When a plurality of dot products is available, e.g., as discussed above with reference to FIGS. 1 and 6, it is desirable to determine which of the dot products is, e.g., the highest-magnitude, lowest-magnitude, most positive, or most negative of the dot products. A winner-take-all (WTA) circuit can be used for this purpose. WTA circuits can also be used for comparing data other than that provided by a memristor array.

Figure 10:
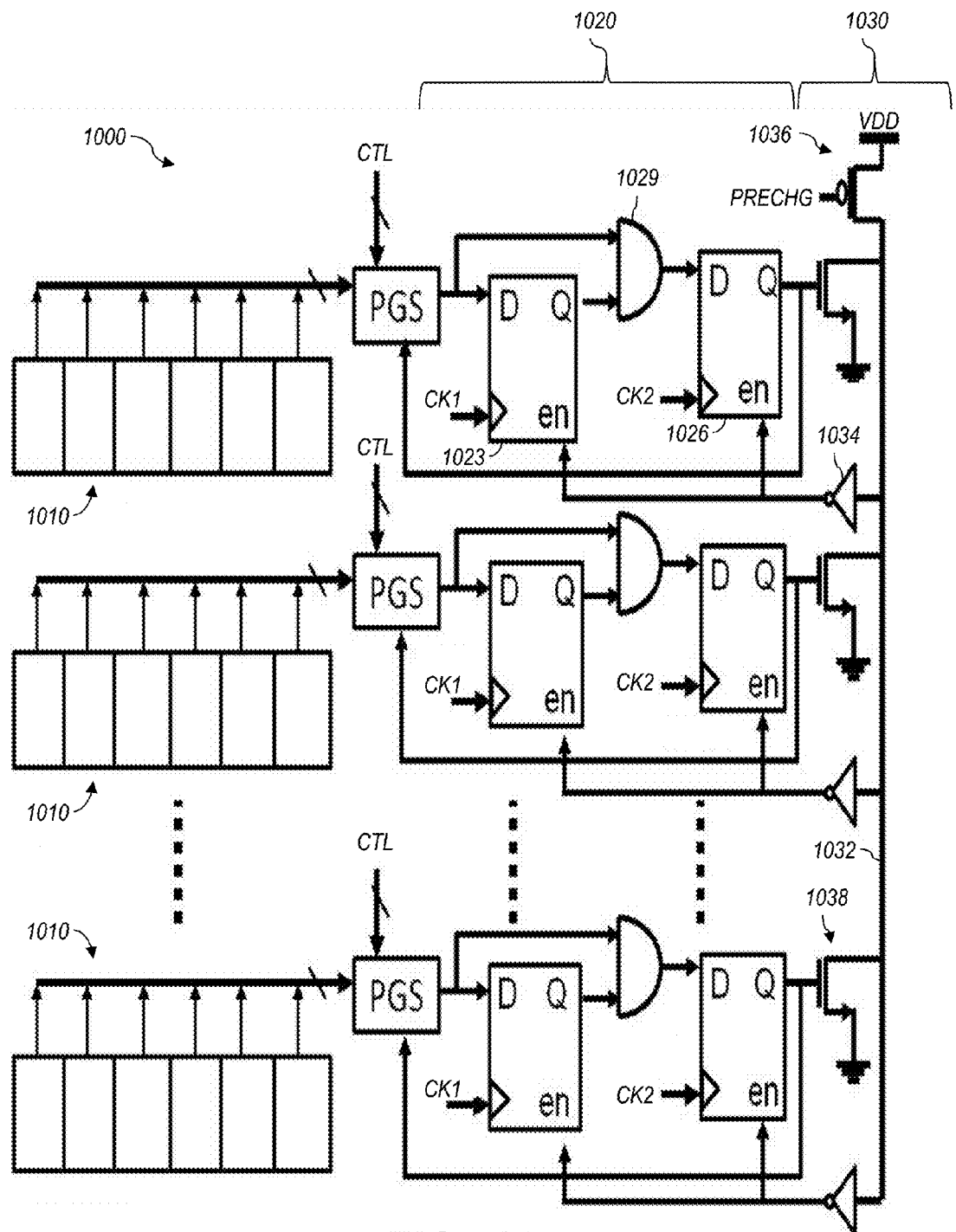
FIG. 10 is a schematic of an exemplary comparison circuit that can perform winner-take-all functions.

FIG. 10 is a schematic of an electronic comparison system including a WTA circuit. The system 1000 comprises a plurality of input stages 1010. Each input stage 1010 is configured to successively provide bits of a respective code word, starting with a most-significant bit thereof.

A plurality of one-shots 1020 are connected to respective ones of the input stages 1010 to successively receive the bits of the respective code words therefrom. Each one-shot 1020 is configured to successively provide a first bit value, e.g., 1, until receiving a bit having a non-preferred value, e.g., 0, concurrently with an enable signal ("en"), and then to provide a second, different bit value, e.g., 0. To locate smaller values rather than larger, the non-preferred value can be 1. The first and second bit values can be interchanged with suitable changes to the circuit, e.g., adding inverters or changing the polarity of gate inputs or outputs.

An enable circuit 1030 is connected to the outputs of the one-shots 1020. The enable circuit 1030 is configured to provide the enable signal if at least one of the one-shots 1020 is providing the first bit value. Enable circuit 1030 can provide the enable signal by driving an output to a signal level corresponding to enabling. In this example, the enable signal is a high-logic-level output from the enable circuit 1030, and enables D flip-flops (DFFs) 1023, 1026 (for clarity, not all are labeled).

In the example shown, enable circuit 1030 includes a node 1032 selectively carrying the enable signal. The enable signal can have a different representation inside the enable circuit 1030 than outside. In this example, node 1032 carries a low logic level when enabled, and inverters 1034 (for clarity, not all are labeled) produce the desired high logic level to enable DFFs 1023, 1026. In another example, inverters 1034 or other components can be connected between enable circuit 1030 and one-shots 120.

Enable circuit 1030 also includes a precharge circuit 1036 configured to precharge the node 1032 to a signal level different from the enable signal, here a high logic level. The illustrated precharge circuit 1036 includes a pullup (e.g., a PFET) that pulls node 1032 to VDD (not providing the enable signal) when the PRECHG control input is low. Enable circuit 1030 in this example further includes a modification circuit 1038 (for clarity, not all are labeled) configured to provide the enable signal on the node 1032 in response to the first bit value from at least one of the one-shots. In this example, node 1032 is connected to a plurality of modification circuits 1038, each including a selective pulldown (e.g., an NFET) that pulls node 1032 to GND (providing the enable signal) whenever the output of a respective one-shot 1020 is outputting a high logic level. In this example, the enable signal corresponds to a low signal level of the node, and the signal level different from the enable signal corresponds to a high signal level of the node.

In the example shown, each of the one-shots 1020 includes an AND gate 1029 (for clarity, not all are labeled) and the first and second D flip-flops (DFFs) 1023, 1026 enabled by the enable signal. The output of the first DFF 1033 and the input of the first DFF 1033 are connected as the inputs of the AND gate 1029. The output of the AND gate 1029 is connected to the input of the second DFF 1026.

In this example, the input stages 1010 include output registers of successive-approximation (SAR) ADCs. Input data in SAR registers 1010 is provided to a chain of flip-flops 1023, 1026. As the number N of inputs increases, hardware size increases linearly (one input stage 1010 and one-shot 1020 per input). As bit width m increases, hardware size also grows only linearly (one bit in each SAR register and each DFF 1023, 1026 per input bit). The number of DFFs 1023, 1026 does not grow with m. In a simulated configuration, at m=6 the power consumption is similar to comparative schemes; for m>6, the power consumption of the inventive hardware is lower than the comparative hardware.

In various aspects, the WTA (including one-shots 1020 and enable circuit 1030) operates in parallel with a SAR ADC, the output registers of which are the registers in the input stage 1010. This system can be pipelined if desired. The WTA can also be used on digital bit-serial inputs, e.g., digitally-computed dot product or other correlation values.

The second half of the WTA algorithm can operate in parallel with the first (i.e., the ADC operation). In various aspects, results of the first ADC conversion step obtained from the SAR are directly transferred to tracking registers (DFFS 1023) through the pass-gate multiplexing switch (PGS). Thus that, at this stage, all the DFFs 1023 with a high output correspond to the ADC results with MSB='1'. In the second cycle operation, the detection line (node 1032) is first pre-charged to Vdd and the set of discharge registers (DFFs 1026), driving it are cleared to low output. Next, if for at least one of the SAR's with high MSB, the second MSB also evaluates to '1', the corresponding DFF 1026 is driven high by the associated AND gate 1029. Thus, node 1032 is discharged to ground and the write of all the DFFs 1023 is enabled.

All the DFFs 1023 for which both, first and second MSB's evaluated to '1', stay high, but the rest are set to low. In an example, if at least one of the SAR's (5-bit) evaluated to '11000' in the second conversion cycle, node 1032 is discharged and DFFs 1023 with SAR value '11000' stay high, while those with SAR value '10000' are set to low. In case all SAR's evaluated to '10000' in the second cycle, no change is made to the values in DFFs 1023. Thus, at the end of conversion cycle, if only one of the DFFs 1023 remains high-output, it is identified as the winner and the corresponding SAR value is effectively the degree of match (DOM).

The winner-tracking circuitry described above is fully digital and does not consume any static power (except for leakage). Moreover, each one-shot 1020 can use common control lines ("CTL"). This permits readily scaling with increases in N or m.

The overall power consumption in various aspects is drastically reduced as compared to a mixed-signal (MS) CMOS realization, due to two main reasons. Firstly, the power consumption in the RCN itself is significantly lowered due to low voltage operation, and secondly, the fully digital WTA structure avoids any additional static power consumption. Note that various WTA schemes implemented in MS-CMOS would result in large power consumption, resulting from conventional ADC's. The low-voltage current-mode switching characteristics of DWN however, provides a compact and low power digitization technique. Various aspects herein can be implemented in a standard digital CMOS process.

Figure 11:
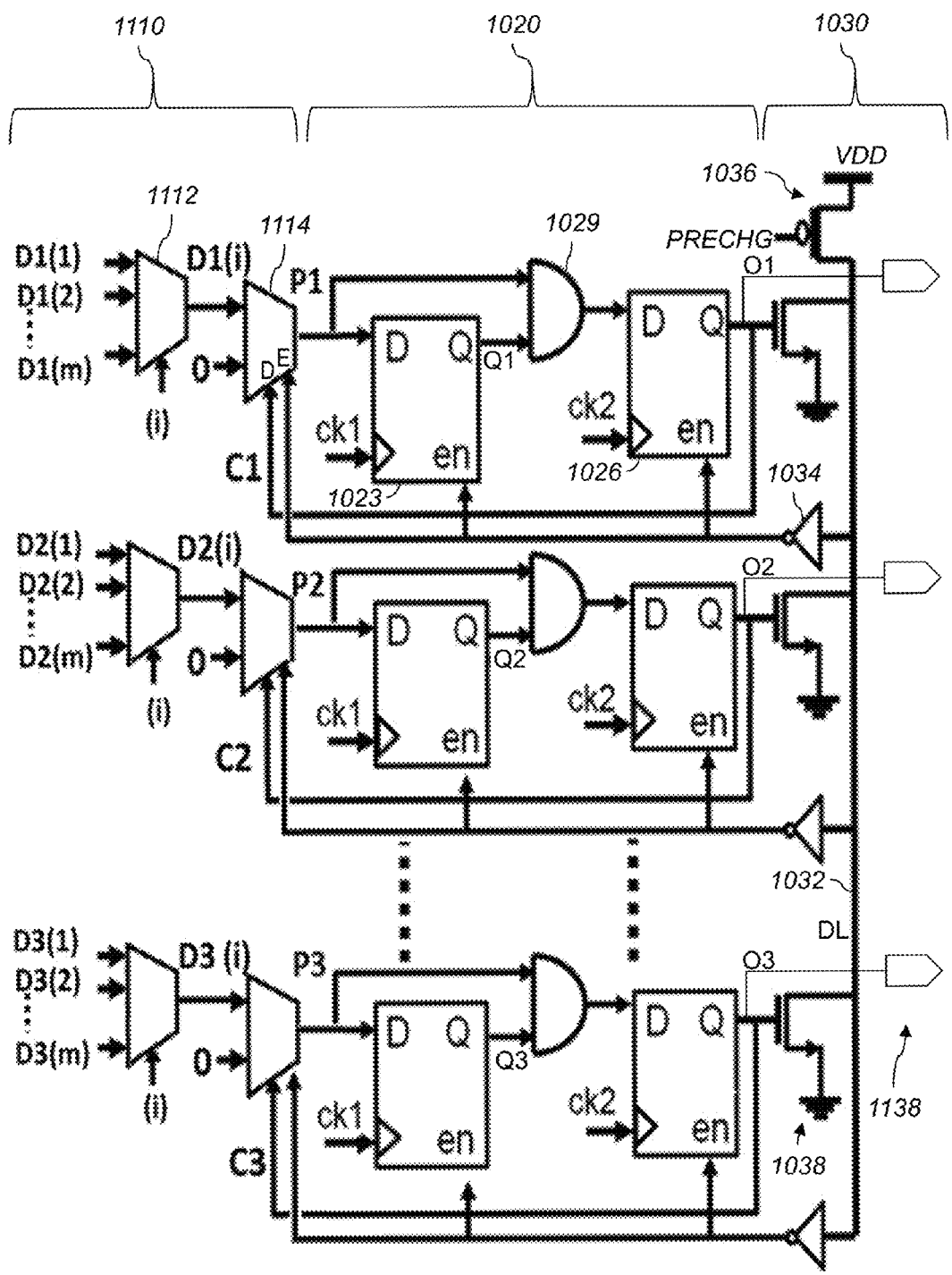
FIG. 11 is a schematic of further details of a winner-take all circuit.

FIG. 11 is a schematic of further details of a winner-take all circuit according to various aspects. This is an example of a spin-CMOS hybrid-PE based on DWN that achieves the WTA functionality at low energy cost, e.g., that performs the winner selection task with negligible static power consumption. The circuit further includes a gate 1110 configured to force the input of the first DFF 1023 to the non-preferred value if the output of the second DFF 1026 is the second, different bit value and the enable signal is provided by enable circuit 1030. In this example, the gate includes multiplexer (mux) 1114, which has its input corresponding to D=0 strapped low (0). Labels C1, O1, P1, Q1, C2, O2, P2, Q2, C3, O3, P3, Q3, and DL are node labels. The outputs 1138 of the WTA circuit are nodes O1, O2, O3. D1, D2, and D3 represent three inputs of which the largest is to be found. Any values can be used for Norm. The MSB is represented (1) and the LSB is represented (m).

In various aspects, each cycle, ones of the inputs that can be determined not to be the winner based on the current bit position i are deselected (On goes low). Input(s) that remain selected after all cycles are the winner or ties for the winner.

Figure 12:
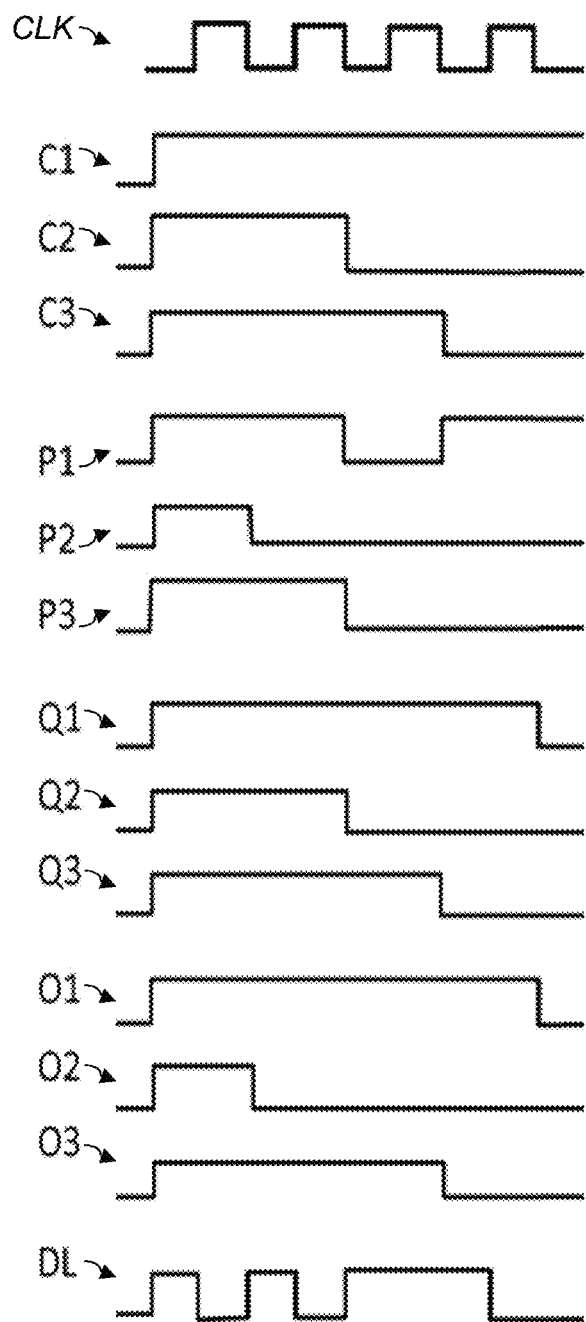
FIG. 12 is a timing diagram showing simulated operation of the circuit of FIG. 11.

FIG. 12 is a timing diagram showing simulated operation of the circuit of FIG. 11. Waveforms are shown for the labeled nodes in FIG. 11. The inputs are D1=1101, D2=1011, and D3=1100 in this example (listed MSB to LSB).

In various aspects the WTA operates in parallel with the SAR-ADC and hence operates on the successive bits of SAR-outputs. Referring to FIG. 12 and also to FIG. 11, in this example, 3 inputs are provided, D1, D2, and D3, each of which is 4 bits wide (N=3, m=4). Two levels of multiplexers (1112, 1114) are shown at the input stage in FIG. 11. The first stage (mux 1112) selects successive input bits of the data $D_j$, starting from the MSB. The second stage of multiplexers (mux 1114) conditionally passes the $i_{th}$ input bit of $D_j$ (which is $D_j(i)$) in the $i_{th}$ cycle of WTA operation. Muxes 1114 are controlled by signals $C_j$ which are same as the outputs of the corresponding WTA branch. In the first ADC conversion step, all $C_j$'s are initialized to '1' hence all $D_j(m)$ (where m is the input bit-size) are directly transferred to the DFFs 1023 shown in FIG. 11. The output of each DFF 1023 is also initialized to '1' in the first cycle. Before each cycle, the Discharge Line (DL) shown in FIG. 11 is pre-charged to '1'. Thus, at the end of $i_{th}$ cycle the DL discharges if any one of the $O_j$'s evaluate to '1'. For the example data-set given in FIG. 12, this implies that in the first cycle all the outputs ($O_i$'s) of the DFFs 1026 evaluate to '1' and hence the DL is discharged. For the first cycle, all the MSB's were detected high, hence none of the three numbers Dj's can be rejected yet. Since all the outputs $O_j$'s and hence the select lines $C_j$'s are high after the first cycle, the $2^{nd}$ bits of all the Dj's are selected by the stage-2 muxes and appear as the signals $P_j$. In the second cycle, O1 and O3 go high, however O2 evaluates to '0' (since $D_1(2)=D3(2)$='1' but D3(2)='0'). The DL is again discharged. But for the next cycle, D2 is discarded from the WTA operation because of C2 turning low. As a result P2, and hence, O2, are clamped to '0' for rest of the cycles. In the 3rd stage, both $D_1(3)$ and D2(3) are '0' hence the DL fails to discharge. As a result all modifications in the DFFs 1023, 1026 and the muxes are disabled (using the 'enable' control shown in FIG. 11). In the 4$^{th}$ cycle, again, $D_1(4)$ and D3(4) are passed to the WTA. Note that the first and third DFFs 1023 are still storing '1' as a result of the previous cycle evaluation; see Q1 and Q3. However, in the last cycle only O1 goes high (since D1(4)='1' and D3(4)='0'), discharging DL. Hence, D3 is discarded from the WTA operation and D1 is identified as the winner, at end of the 4$^{th}$ cycle.

A fully parallel bit-serial digital Winner Take All (WTA) circuit according to various aspects described above can advantageously identify the largest among N m-bit words in m cycles, even if N is a large number. The time taken by various WTA circuits herein to identify the maximum among the m-bit inputs is independent of the number of inputs N. This advantageously provides fast, low power WTA operation compared to prior schemes. Various WTAs herein can be combined with bit-serial data processing circuits such as bit-serial digital hardware for, e.g., Hamming-distance calculation or Successive Approximation Register Analog to Digital conversion (SAR-ADC); various of these combinations can be used in pattern matching hardware.

The operation of various WTAs herein is based on a new algorithm for detecting a winner among large number of parallel bit-serial inputs. The WTA can include a digital controller circuit and a digital logic block.

Various aspects can determine the highest of the N input values or the lowest, by interchanging 1 and 0 in the discussion above. In various aspects, a clock-driven pre-discharge circuit is operated by the logic and controller. An exemplary WTA starts comparing N m-bit inputs from the MSB position and proceeds towards the LSB in a total of m cycles. (Various aspects include one or more additional cycles for latency or pipelining, but the number of additional cycles does not vary with N.) In each cycle, any inputs determined to be smaller than the current maximum (e.g., any input with a 0 bit in the same position as a 1 bit in another input) (or larger, e.g., with a 1 bit where others have a 0 bit) are discarded from the comparison using the control and logic circuits. Inputs that are not clearly smaller (larger) than another input in the bit position under test are considered during subsequent stage(s) of comparison, where the next lower bit of significance, then the next, . . . , down to the LSB, is compared using the inventive charge-discharge circuit. The total process takes m+O(1) cycles for m-bit comparison and hence the total delay is independent of the number of WTA inputs N.

Figure 13:
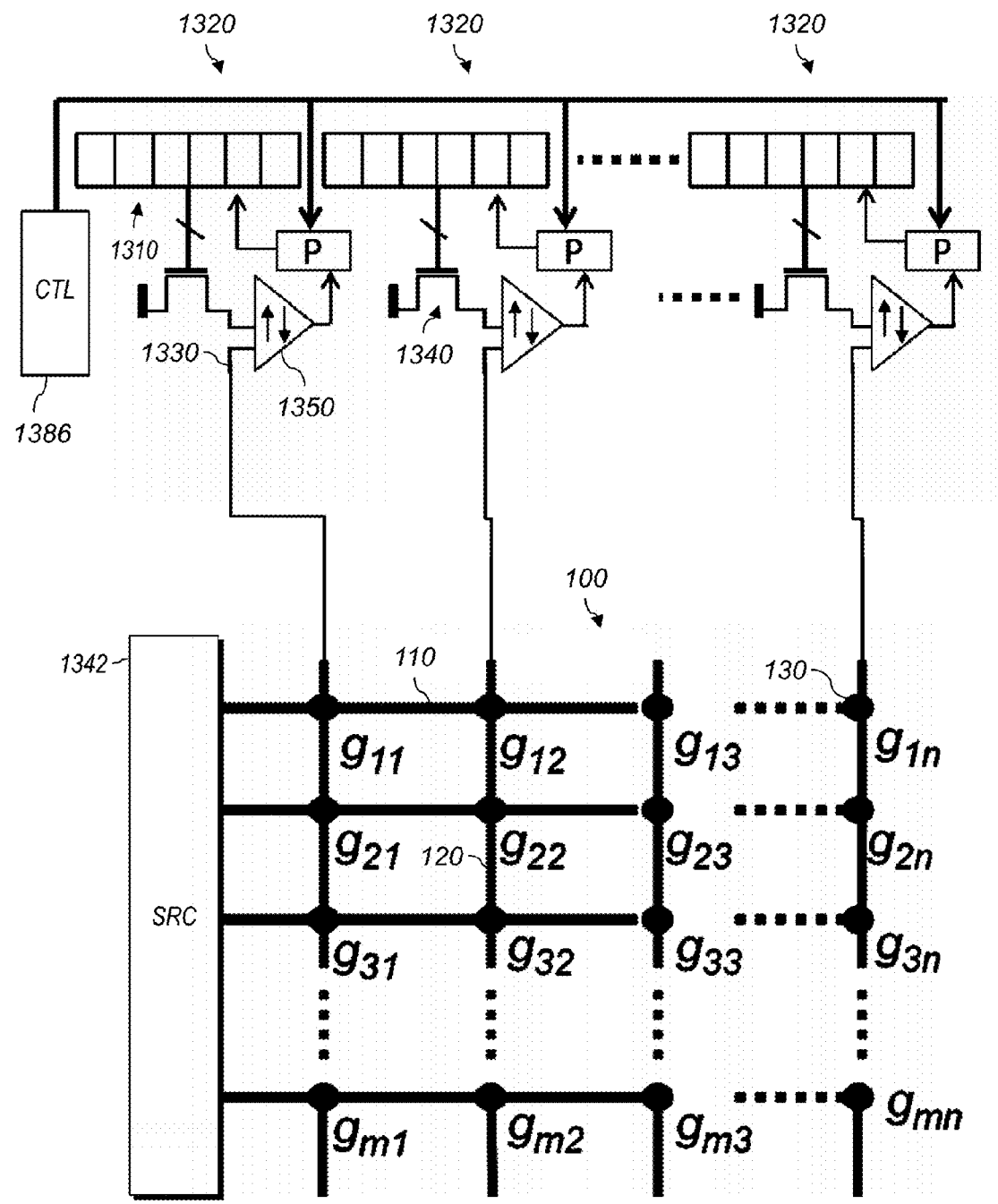
FIG. 13 is a schematic of an exemplary successive-approximation circuit, resistive crossbar memory, and related components.

FIG. 13 is a block diagram of a SAR ADC and related components of a comparison system useful with resistive memory and WTA circuits. For clarity, not all instances of all components are labeled. This SAR ADC can also be used in other contexts. The comparison system includes controller 1386 programmed to sequence through a selected number of bits (e.g., 1 . . . m in the example of FIGS. 11 and 12). The system also includes a plurality of successive-approximation analog-to-digital converters (ADCs) 1320. Each input stage 1010 (FIG. 10) successively receives the bits from a respective one of the ADCs 1320. In an example, controller 1386 loads registers 1310 with 1000 . . . 0 (the unsigned middle-scale output) and sequences from MSB to LSB, one bit per clock cycle.

Each ADC 1320 includes input terminal 1330 and register 1310 connected to the respective input stage 1010 to successively provide the bits. Register 1310 can alternatively be part of input stage 1010.

Programmable reference 1340 provides a reference electrical signal in response to the value in the register 1310. Programmable reference 1340 can include, e.g., a binary-weighted transistor digital-to-analog converter (DAC) responsive to the value in the register to provide the reference electrical signal. Other DACs noted above with reference to FIG. 6 can also be used.

Comparator 1350 is configured to compare an electrical signal at the input terminal 1330 to the reference electrical signal and adjust a bit in the register 1310 indicated by the controller 1386. Comparator 1350 includes a domain-wall neuron connected to the input terminal 1350 and the programmable reference 1340 and a CMOS latch (FIG. 5) configured to compare an output of the domain-wall neuron with a selected threshold and store a bit value according to the result of the comparison.

In various aspects, the system also includes crossbar array 100 having a plurality of row electrodes 110, a plurality of column electrodes 120, and a plurality of resistive memory elements 130, each memory element 130 directly connected to one of the row electrodes 110 and one of the column electrodes 120; and a signal source 1342 configured to apply a plurality of test electrical signals to respective ones of the row electrodes 110. The column electrodes 120 are electrically connected to the input terminals of the respective ADCs 1320 in this example.

The "RCB network" is the column lines. Triangles are spin neurons. Outputs of neurons drive DTCS (binary-weighted) values. Value in SAR register is converted to a current by the DTCS, then compared to the dot product output. P is a Pass gate that modifies SAR value. E.g., if SAR is higher, reduce SAR.

The circuit realization of this operation using DWNs is shown in FIG. 13. Output currents of the RCN columns (e.g., 40 columns storing the pattern vectors of 40 face-images; see FIGS. 20-21) are received by individual DWN input nodes that are effectively clamped at a DC supply V, as described earlier. Each DWN has an associated DTCS-DAC, which is driven by the corresponding successive approximation register 1310. The drain terminals of the DTCS transistors are a DC voltage V-ΔV. In each conversion cycle, the DWN device essentially compares the RCN output and the DAC output (and hence acts as the comparator of the SAR block). The comparison result is detected by the latch described in FIG. 5, and the result is used to modify the register 1310 though pass-gate based multiplexers P, driven by controller 1386. In various aspects, the component of RCN output current sunk by the DTCS in the ADC's flow through across a DC level of 2ΔV. Note that for a neuron resistance of ~50Ω, the current injection into it towards the final conversion steps (more MSB's) will be less than 5 μA (note, only the difference between DAC output and the dot-product output enters the neuron). This leads to a voltage drop of less than 0.3 mV.

The DWN device essentially acts as a low voltage, high speed, high resolution current-mode comparator and hence can be exploited in digitizing analog current levels at low energy cost. Various WTA techniques, algorithmically depicted in FIG. 14, combine a digitization step with a parallel 'winner-tracking' operation.

Figure 14:
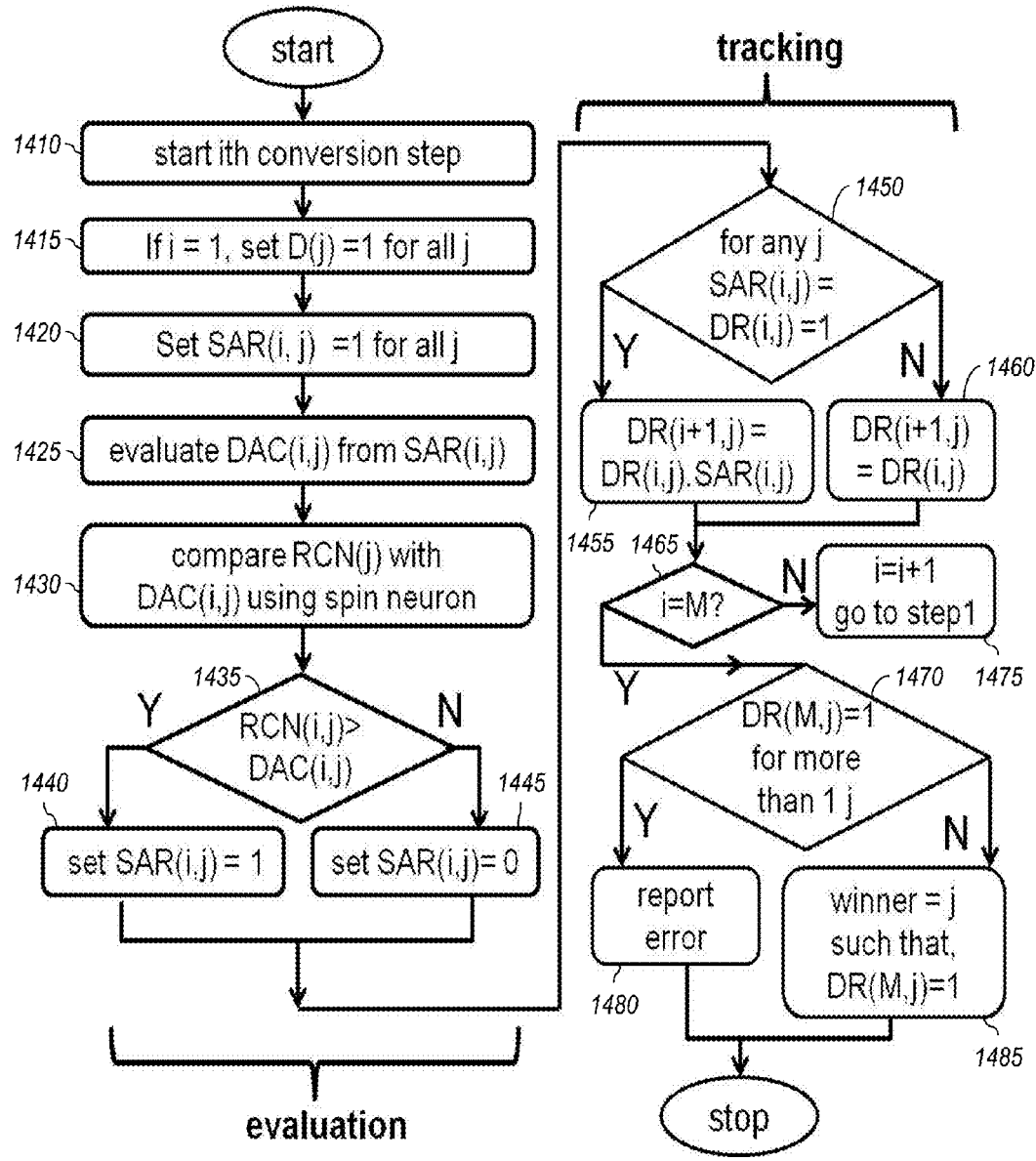
FIG. 14 is a flowchart illustrating exemplary methods for performing analog-to-digital conversion or a winner-take-all sequence useful with various circuits shown in FIGS. 10-13.

FIG. 14 shows a flowchart illustrating an exemplary method for successive approximation and winner-take-all determination. The steps can be performed in any order except when otherwise specified, or when data from an earlier step is used in a later step. In at least one example, processing begins with step 1410. For clarity of explanation, reference is herein made to various components shown in FIGS. 1-13 that can carry out or participate in the steps of the exemplary method. It should be noted, however, that other components can be used; that is, exemplary method(s) shown in FIG. 14 are not limited to being carried out by the identified components.

The first half of the flowchart is an exemplary algorithm for successive approximation register (SAR) ADC. To begin the conversion, the approximation register (that stores the digitization result) is initialized to the midscale (i.e., all but the most significant bit is set to 0). At every cycle a digital to analog converter (DAC) produces an analog level corresponding to the digital value stored in the SAR (step 1425) and a comparator compares it with the analog input using an analog comparator (step 1430, 1435). If the comparator output is high, the current bit remains high (step 1440), else it is turned low (step 1445) and the next lower bit is turned high. The process is repeated for all the bits. At the end of conversion, the SAR stores the digitized value corresponding to the analog input.

The second half of the WTA algorithm operates in parallel with the first (i.e., the ADC operation), as described above with reference to FIG. 10. DFFs 1023 are referred to in the flowchart as "TR"; DFFs 1026 are "DR"; node 1032 is "DL"; register 1010 is "SAR".

Figure 15:
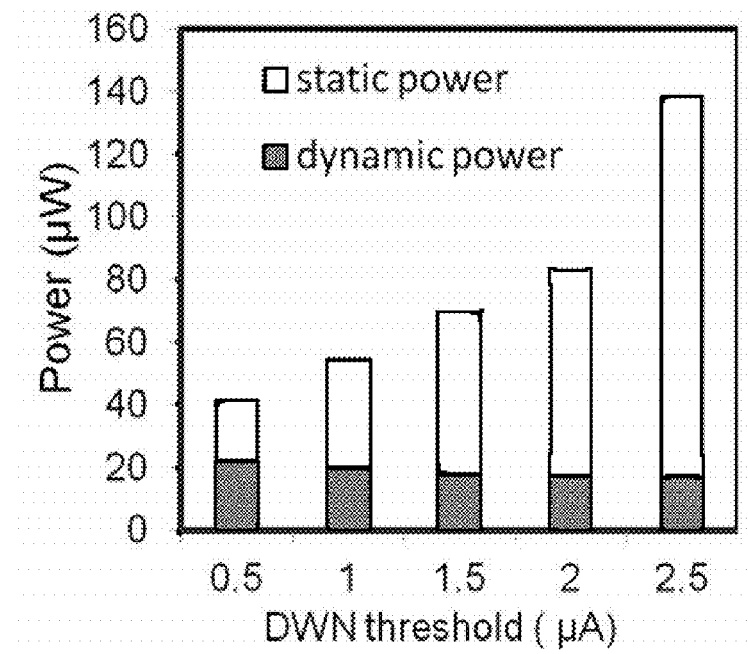
FIG. 15 is a simulated plot of simulated power consumption of a winner-take-all (WTA) circuit.

FIG. 15 shows results of a simulation of power consumption (OAT) of an exemplary design (for 1-step matching for 40 individual templates, as discussed below) with its static and dynamic components, for different values of DWN threshold (μA).

Simulations for MS-CMOS designs show that the power consumption for the WTA unit dominates the total power. On the other hand, for inventive techniques herein, there is negligible static power consumption in the WTA operation. However, since, the static power consumption in RCN is also significantly lowered, it becomes comparable to the dynamic switching power in the WTA. This is evident from the trend shown in FIG. 15. It also shows that the static power consumption in the DWN-based design can be significantly reduced by lowering the DWN switching threshold further. However, the dynamic power remains almost constant and starts to dominate for reduced DWN thresholds.

In order to compare the performance of various aspects with state of the art mixed signal (MS) CMOS design, two different analog CMOS designs were simulated. These designed employed binary tree WTA circuits according to two prior schemes, using 45 nm CMOS technology models. The first design is the standard BT-WTA, whereas, the second is a recently proposed modification. A third 45 nm digital CMOS design was also simulated and employed multiply and accumulate operations for evaluating the correlation between the 5-bit 128 element digital templates and input features of the same size.

A micro-magnetic simulation model was used for DWN. The model that was calibrated with experimental data on DWMs. Effect of thermal fluctuation and device heating were also considered for characterizing the device. Behavioral model based on statistical characteristics of the device were used in SPICE simulation to assess the system level functionality. Some design parameters used are listed in Table 1.

TABLE 1

| Design parameters | | | |
|---|---|---|---|
| Template size | 16 × 8, 5-bit | Magnet material | NiFe |
| # template | 40 | free-layer size | 3 × 33 × 60 nm³ |
| comparator resolution | 5-bit | Ms | 800 emu/cm³ |
| Input data rate | 100 MHz | Ku2V | 20KT |
| crossbar parasitics | 1 Ω/μm, 0.4 fF/μm | Ic | 1 μA |
| | | $T_{switch}$ | 1.5 ns |
| Crossbar material | Cu | Cross-bar material | Cu |
| memristor material | Ag-aSi | Resistance range | 1 kΩ to 32 kΩ |

Figure 16:
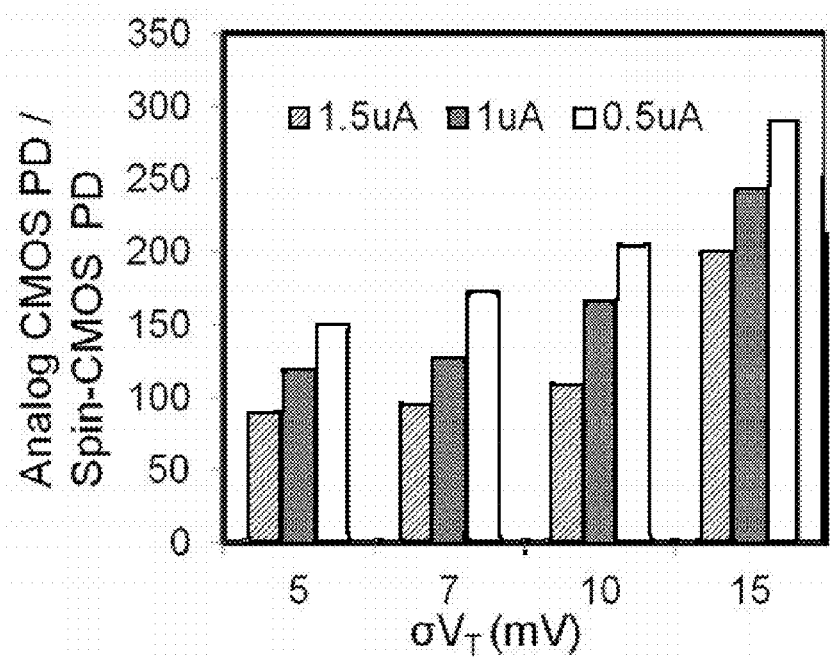
FIG. 16 is a simulated plot of simulated relative power-delay products for an inventive aspect.

FIG. 16 shows the ratio of power-delay (PD) product of MS-CMOS and an exemplary design for increasing transistor variations (mV) at various DWN thresholds (μA). As can be seen, MS-CMOS performs substantially worse (much higher power-delay product) than inventive aspects herein, and the relative advantage of inventive techniques improves at higher threshold-variation levels and higher DWN thresholds.

The plot in FIG. 16 shows the impact of transistor process variations upon MS-CMOS designs. The power-delay products are plotted for a WTA resolution of 4%. Note that in an inventive WTA described herein, the impact of transistor-variations in the DTCS-DAC is limited to just a single step, whereas, the MS-CMOS circuits suffer more due to the cumulative effect of multiple transistors in the signal path. As discussed above, with larger variations, the accuracy and resolution of MS-CMOS circuits like current-mirrors decreases steeply, necessitating the use of larger devices, which impairs the circuit performance.

Table 2 compares a spin-CMOS design according to an aspect with prior MS-CMOS designs, and with the 45 nm digital CMOS design. The device parameters for the design used for Table 2 are given in Table 1. The results shown are for $\sigma V_T$=5 mV for minimum sized transistors. Results for three different WTA resolutions are given which show similar energy benefits of the inventive technique, even for smaller WTA resolution. Energy is given in relative units, and Table 2 compares power numbers and performance for the dot product operation and the WTA together. For analog designs, lower resolution constrain allows smaller transistors and hence better performance. Power consumption for the DWN based design, also reduces with resolution. Lower WTA resolution allows smaller DAC currents, resulting in reduced static power and lower switched capacitance for the smaller WTA blocks, leading to reduced dynamic power.

Results for comparison with 45 nm digital hardware shows ~1000× lower computing energy for the inventive technique. Note that, this comparison does not include the overhead due to memory read in the digital design. As discussed earlier, digital hardware in general prove inefficient for the class of computation considered herein. Also, the use of MS-CMOS circuits in RCN barely perform ~10× better than the digital implementation and hence achieve far less energy efficiency as compared to inventive designs herein. Thus, low-energy analog computing using spin neurons can significantly enhance the prospect of RCN technology for computational hardware.

TABLE 2

| | Performance | | | |
|---|---|---|---|---|
| | spin-CMOS PE | [18] | [17] | 45 nm Digital CMOS |
| Power | | | | |
| 5-bit | 65 μW | 5.5 mW | 8 mW | 4 mW |
| 4-bit | 45 μW | 2.9 mW | 5.0 mW | 2.8 mW |
| 3-bit | 32 μW | 2.3 mW | 3.2 mW | 1.2 mW |
| Frequency | 100 MHz | 50 MHz | 50 MHz | 2.5 MHz |
| Energy | | | | |
| 5-bit | 1 | 160 | 215 | 2460 |
| 4-bit | 1 | 140 | 221 | 2300 |
| 3-bit | 1 | 155 | 210 | 1100 |

Inventive designs herein can achieve more than three orders of magnitude lower energy cost as compared to a dedicated digital hardware. The use of spin-torque neurons can therefore boost the prospects of RCN as a computation tool.

Figure 17:
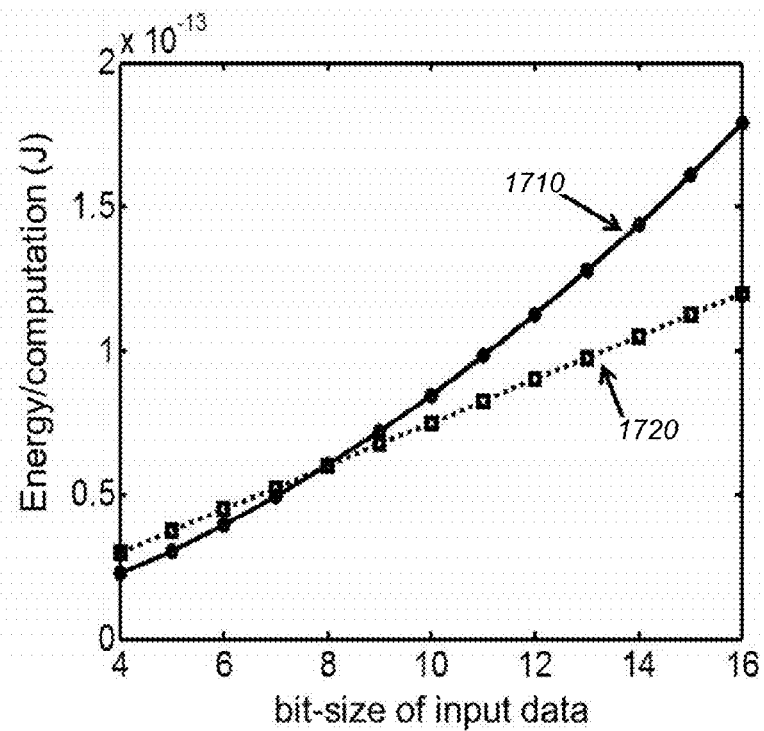
FIG. 17 shows simulated energy dissipation of comparative and inventive WTA circuits as a function of input bit-size.

FIG. 17 shows simulated energy dissipation of comparative and inventive WTA circuits as a function of input bit-size m. Curve 1710 shows the comparative scheme and curve 1720 shows the inventive technique. As can be seen, the inventive technique requires lower energy per computation in the WTA circuit than the comparative scheme above m=8. Combining a spin-neuron based SAR ADC and an inventive WTA, as described above, can provide further relative power advantages over comparative ADC+WTA circuits.

Figure 18:
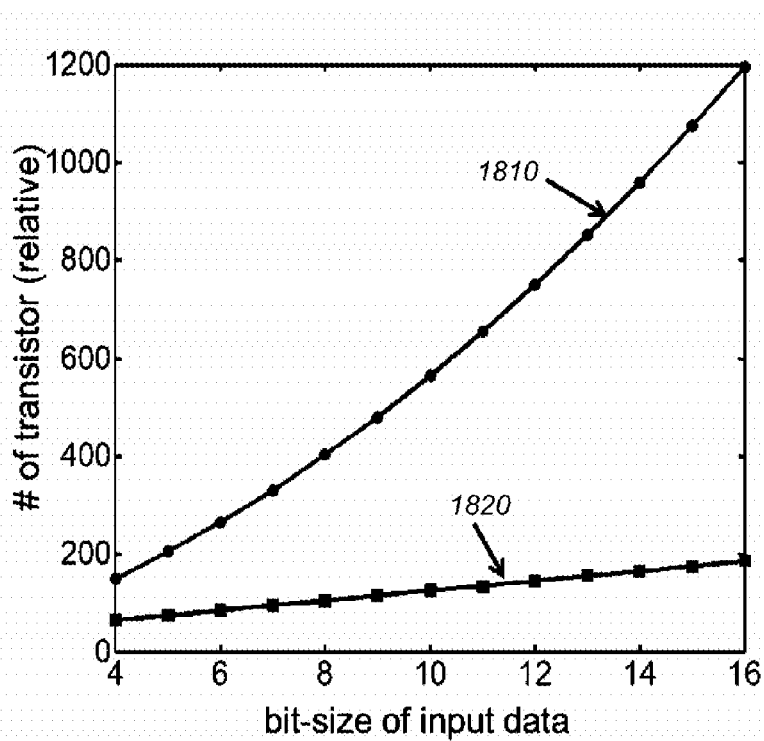
FIG. 18 shows simulated relative areas of comparative and inventive WTA circuits as a function of input bit-size.

FIG. 18 shows simulated relative areas of comparative and inventive WTA circuits as a function of input bit-size m. Curve 1810 shows the comparative scheme and curve 1820 shows the inventive technique.

Figure 19:
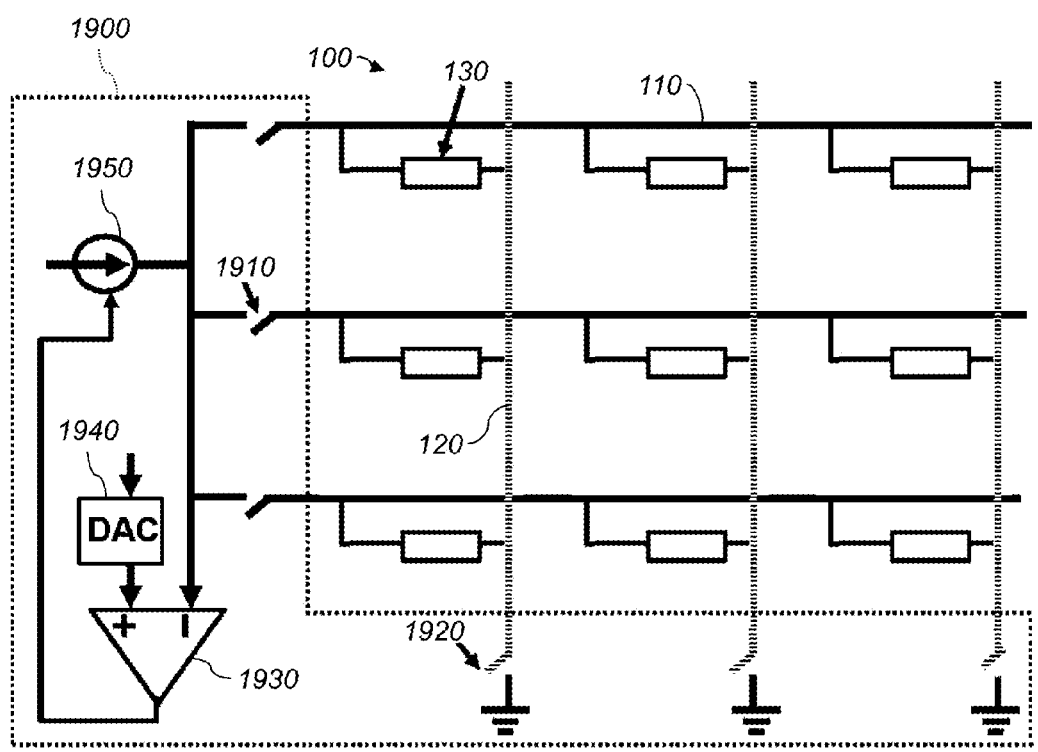
FIG. 19 shows an exemplary resistive memory array and writing circuit.

FIG. 19 shows a resistive memory array 100 and a writing circuit 1900 configured to store selected values in the resistive memory elements (memristors 130). Writing circuit 1900 in this example includes multi-level writing hardware for memristors 130, using adjustable pulse-width. The memristor-cells 130 to be written are selected by choosing the corresponding set of the row electrode 110 and the column electrode 120. A single write unit can be shared among large number of rows, as shown, or each row can have a dedicated programming cell for faster write time. One column can be written at a time, by selecting a particular column electrode 120.

In a crossbar array 100, consisting of large number of memristors 130, write voltage applied across two cross connected bars (one row 110, one column 120) for programming the interconnecting memristor 130 can also results in sneak current paths through neighboring devices. This can disturb the state of unselected memristors. To overcome the sneak path problem, application of access transistors and diodes can be used. Methods for programming one memristor 130 at a time without access transistors can also be used. In this example, row electrodes 1910 are connected to row switches 1910 and column electrodes 120 are connected to column switches 1920. As long as only one of the row switches 1910 and one of the column switches 1920 is closed at a time, only one memristor 130 will be programmed.

In order to accomplish the write operation, a constant current can be injected into the selected memristor 130 and the voltage developed on the row electrode 110 is compared with a comparator threshold by comparator 1930. The threshold, in turn, is set proportional to the target resistance, by using a compact switched capacitor digital to analog converter (DAC) 1940. The current source 1950 is disconnected as soon as the accessed memristor 130 acquires the target resistance value. A lower value of write current results in slower ramp in the resistance value and hence, allows more precise tuning Various memristive devices (including Ag—Si) exhibit a finite write threshold for an applied current/voltage, below which there is negligible change in the resistance value. As described above, application of spin-based neurons in RCN facilitates ultra-low voltage (and hence low current) operation of the memristors 130 for computing and hence, can achieve reduced read-disturb for the array.

The write precision in the method described above is mainly limited by random offset of the comparator 1930 and inaccuracy in the current source 1950 and the DAC 1940.

In various examples, components shown in FIGS. 10, 13 and 19 are used together. Specifically, an electronic comparison system according to this example includes controller 1386 or another controller configured to automatically receive an input vector and a plurality of test vectors. Examples are discussed below with reference to FIGS. 20 and 21. Controller 1386 operates writing circuit 1900 to store values from each of the test vectors in the resistive memory elements (memristors 130) directly connected to a respective one of the column electrodes 120. That is, each test vector runs down one column, as described above with reference to FIG. 1. In aspects using nonvolatile resistive memory elements, the test vectors can be written once and used multiple times. Controller 1386 is further configured to operate the signal source 1342 to apply the test electrical signals corresponding to the input vector to the row electrodes 110. Controller 1386 is yet further configured to determine which one(s) of the test vectors satisfy a selected criterion with respect to the input vector using the outputs of the one-shots 1020 or another WTA circuit. In this way, complex pattern-matching and -searching tasks can be performed in a more power- and space-efficient way.

Figure 20:
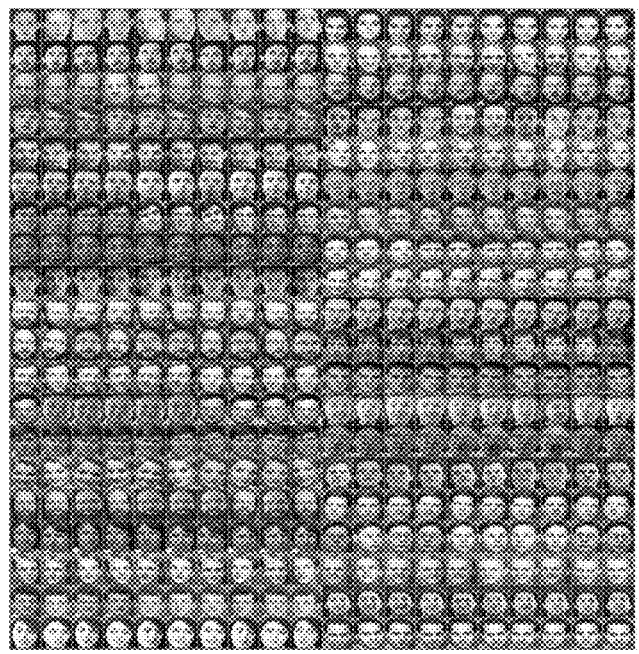
FIG. 20 is a graphical representation of test images.

FIG. 20 is a graphical representation of 400 test images, 10 test images for each of 40 individuals. These images are from the Database of Faces provided by AT&T Laboratories Cambridge. The represented images were used in simulations of comparison circuits according to various aspects described herein.

Figure 21:
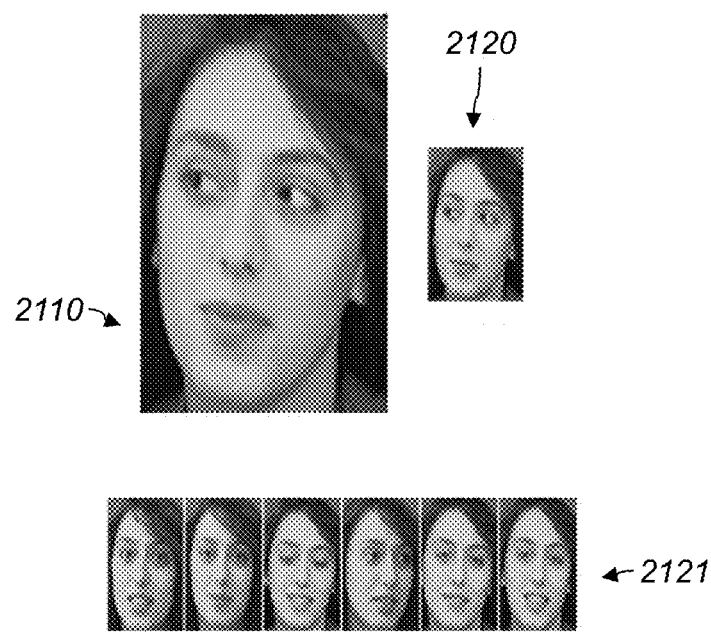
FIG. 21 is a graphical representation of data used in a feature extraction method for human face-images.

FIG. 21 graphically represents data used in a feature extraction method for human face-images. These steps can also be used for non-face images. In this example, 10 different face-images are used for 40 individuals (FIG. 20), resulting in a total of 40 stored data patterns. For each individual, each of the 10 face-images 2110 was normalized and down sized from 128×96, 8-bit pixels to a 16×8, 5-bit pixel image 2120. A pixel wise average of the 10 reduced images 2120, 2121 was taken to generate 128-element (16×8), 32-level analog patterns corresponding to each of the 40 individual faces. In an example, pattern extraction algorithms such as k-mean clustering are used to determine a "mean" image for each of the 40 people using multiple downsized of the same person with different expressions images 2120, 2121. The mean image is then stored in the RCN. Using a mean image permits more readily recognizing faces with, e.g., different expression or orientations.

In a simulation, a resolution of 4% (5-bit) was chosen. Resolving ~4% difference among the current-mode dot product results requires a precision of 5-bits for the detection unit, responsible for identifying the winning pattern. As described above with reference to FIG. 6, in order to perform associative matching of an input face-image with the data stored in the RCN, each of the 128 digital values is converted into an analog voltage or current level, to be applied to the RCN row electrodes 110. For the data set of 400 individual images (with 40 mean templates stored in the array), a simulated WTA design of 5-bit resolution resulted in ~93% matching accuracy.

The patterns are analog, so an RCN and WTA can be used to determine whether a test image of an input face image matches any of the patterns. The analog patterns are stored in resistive memory. Input patterns of current or voltage are applied on the rows and the dot products of the input and each stored vector are received on the columns as currents or voltages. The resulting analog vector of currents or voltages can be digitized using a spin neuron and a SAR ADC. A WTA circuit running in parallel can then determine the closest match.

Various aspects can be useful for pattern-matching hardware. Some aspects match stored patterns with input data and select the winner among a large number of stored patterns. WTA circuits herein can lead to low power and compact designs for such pattern-matching hardware, which is of great interest in the field of cognitive computing. A WTA herein can be fabricated in a standard CMOS process. Patterns do not have to be face images. In an example, if a random image is input to the hardware, various aspects will still identify the 'winning' pattern. But if the degree of match (DOM) is lower than a predetermined threshold, the winner can be discarded, implying that the input image does not belong to the stored data set.

The basic associative memory module (AMM) unit herein, including an RCN, SAR ADC, and WTA, can be extended. For example, very large number of images can be grouped into smaller clusters that can be hierarchically stored in the RCN modules. Individual patterns of larger dimensions can also be partitioned and stored in modular RCN blocks. Various aspects are applicable to a wide class of non-Boolean computing architectures that also include different categories of neural networks. For instance, the spin-RCN based correlation modules presented in this work can provide energy efficient hardware solution to convolutional neural networks that are attractive for cognitive computing tasks, but involve very high computational cost.

Figure 22:
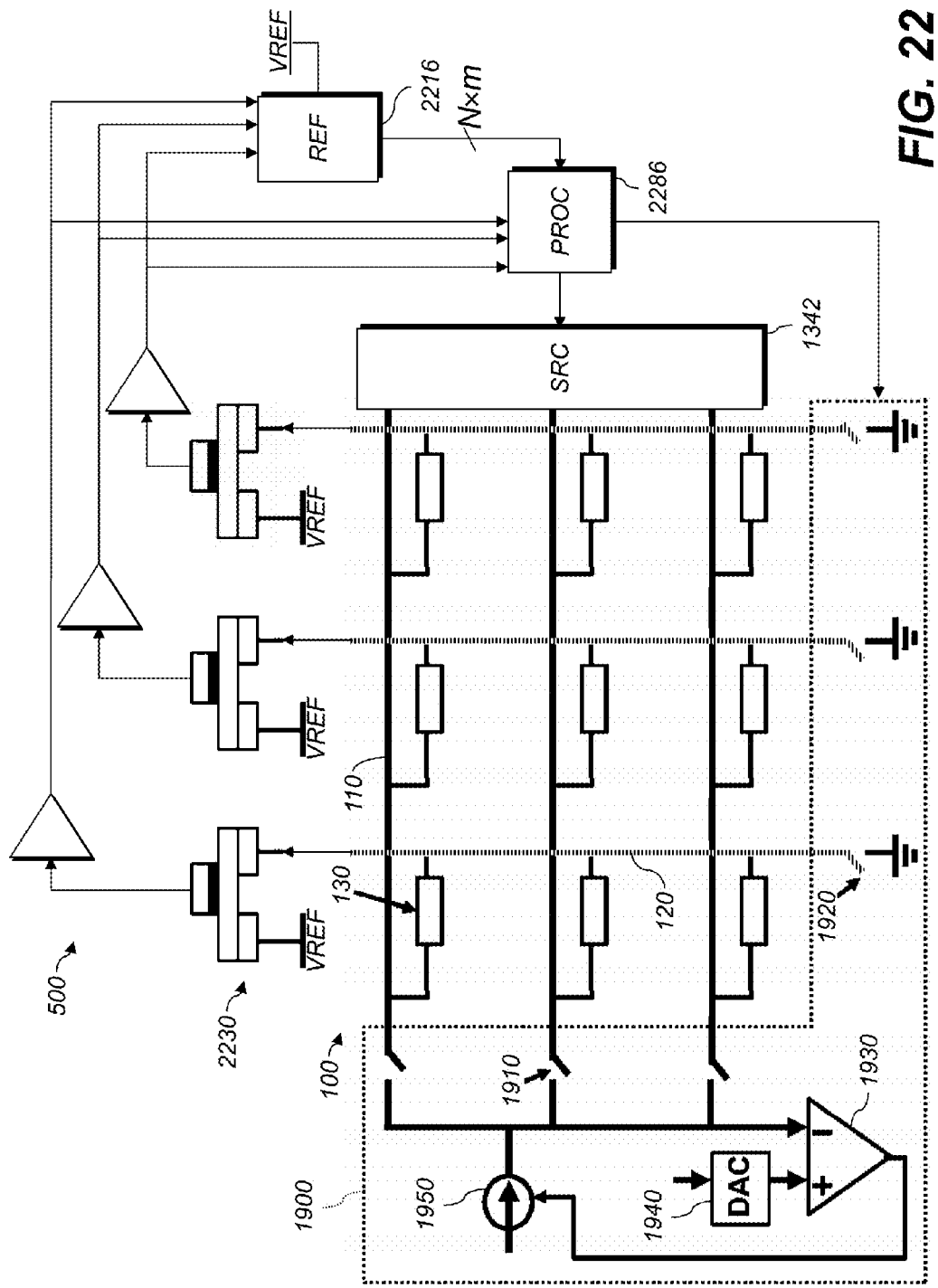
FIG. 22 is a schematic of an exemplary neural network system.

FIG. 22 shows an exemplary neural network system, comprising a crossbar array 100 having a plurality of row electrodes 110, a plurality of column electrodes 120, and a plurality of resistive memory elements, e.g., memristors 130. Each memory element 130 is directly connected to one of the row electrodes 110 and one of the column electrodes 120. Writing circuit 1900 is configured to store selected weights in the resistive memory elements 130, as described above. Signal source 1342 is configured to apply a plurality of test electrical signals to respective ones of the row electrodes 110, also as described above. Reference source 2216 is configured to provide one or more reference electrical signal(s) (individually or collectively referred to as "VREF").

Comparators 2230 are each configured to compare an electrical signal on a respective one of the column electrodes 120 to a corresponding one of the reference electrical signal(s). Each comparator 2230 includes a domain-wall neuron 300 connected to the respective column electrode 120 and the reference source 2216, as discussed above with reference to FIGS. 3 and 5. Each comparator 2230 also includes a CMOS latch 500 configured to compare an output of the domain-wall neuron 300 with a selected threshold and store a bit value according to the result of the comparison.

In various aspects, processor 2286 is configured to receive the respective stored bit values of the comparators 2230 from the latches 500. Processor 2286 determines updated weights using the selected weights stored in the memristors 130, the test electrical signals, and the received bit values. This can be done using known neural-network training algorithms such as those described in U.S. Pat. No. 8,694,451, incorporated herein by reference, or other supervised, unsupervised, or reinforcement algorithms, including but not limited to gradient-descent algorithms, particle-swarm optimization, genetic algorithms, evolutionary methods, simulated annealing, or expectation-maximization or other mathematical optimization methods. Processor 2286 then causes the writing circuit to store the updated weights in the resistive memory elements. In this way, the neural network can improve its performance on classification tasks.

Various aspects use analog rather than digital outputs. In these aspects, reference source 2216 includes a controller 1386 (FIG. 13) programmed to sequence through a selected number of bits, starting with a most-significant bit of the selected number of bits and a plurality of reference circuits, each configured to provide one of the reference electrical signal(s) to a respective one of the comparators. Each reference circuit includes a register 1310 configured to hold respective values for the selected number of bits; and a signal generator 1340 that provides the respective one of the reference electrical signals in response to the values in the register 1310. Each signal generator 1340 can include a binary-weighted transistor digital-to-analog converter (DAC) responsive to the values in the respective register 1310 to provide the respective one of the reference electrical signals.

The controller 1386 is configured to successively update the bits of each of the registers 1310 in the sequence according to the stored bit value in the respective one of the comparators 2230 (or 1350, FIG. 13). That is, the outputs of CMOS latches 500 are used by reference source 2216 to populate the registers 1310 with the digital representations of the analog values. Reference source 2216 changes VREF while controller 1386 cycles through the bits so that the values stored in the latches 500 are usable to successively approximate the analog values on the column lines 120 more and more accurately.

In various aspects, the reference source 2216 can then provide the digital values of registers 1310, e.g., N values, each with m bits, one for each column line 120, to processor 2286. Processor 2286 can then receive the respective bit values in the registers 1310, determine updated weights using the selected weights, the test electrical signals, and the received bit values, and cause the writing circuit 1900 to store the updated weights in the resistive memory elements 1300. In this way, processor 2286 can conduct neural network training as described above, but using analog outputs rather than digital. Processor 2286 can also use a combination of analog and digital outputs in neural-network training.

In view of the foregoing, various aspects provide lower-power, lower-area winner-take-all circuits and neural networks. A technical effect of various aspects is to receive input data and efficiently compare it to a set of known patterns.

Figure 23:
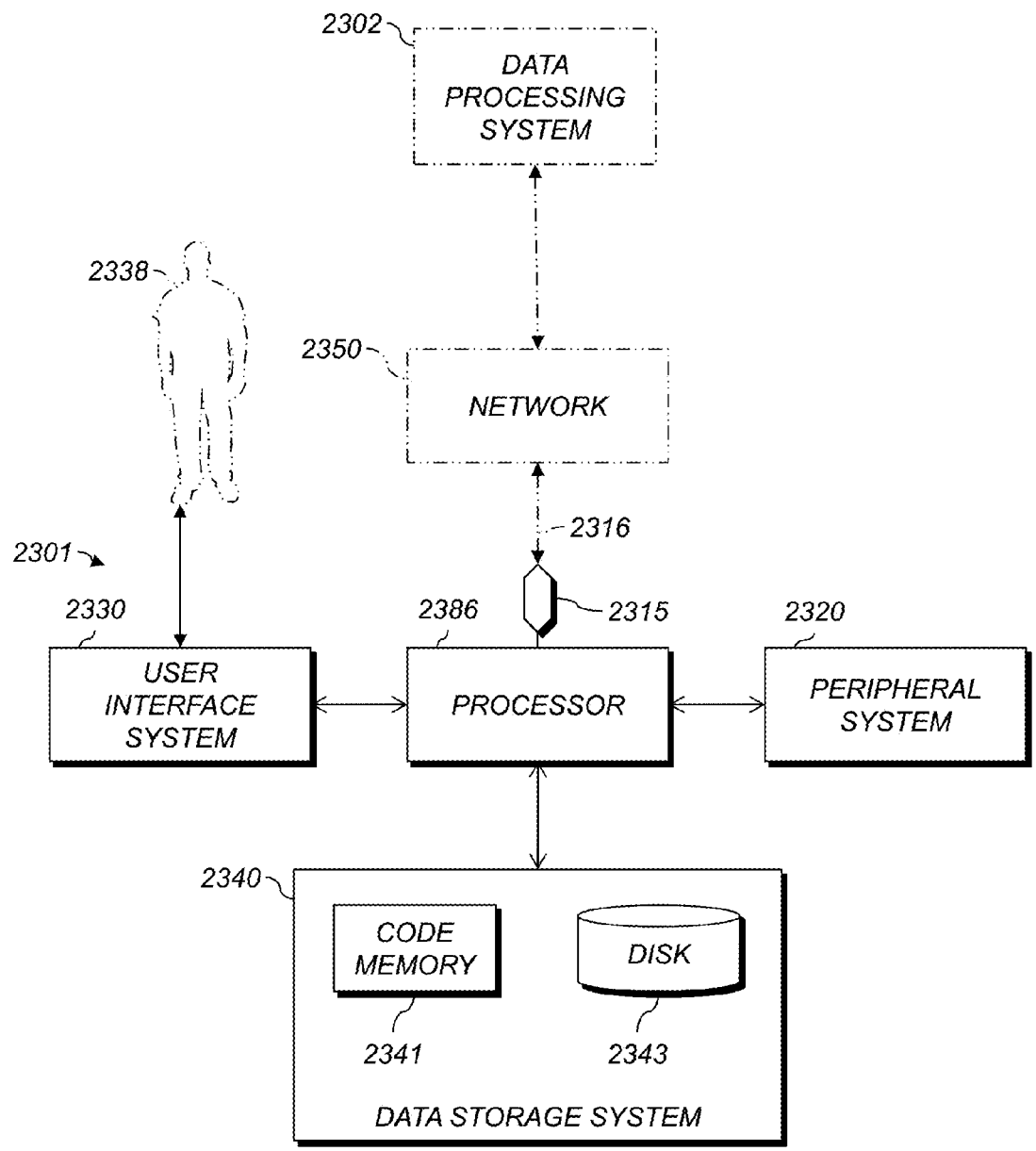
FIG. 23 is a high-level diagram showing components of a data-processing system.

FIG. 23 is a high-level diagram showing the components of an exemplary data-processing system 2301 for analyzing data and performing other analyses described herein, and related components. The system 2301 includes a processor 2386, a peripheral system 2320, a user interface system 2330, and a data storage system 2340. The peripheral system 2320, the user interface system 2330 and the data storage system 2340 are communicatively connected to the processor 2386. Processor 2386 can be communicatively connected to network 2350 (shown in phantom), e.g., the Internet or a leased line, as discussed below. Each of various devices discussed above can include one or more of systems 2386, 2320, 2330, 2340, and can each connect to one or more network(s) 2350; such devices include but are not limited to source 1342 and controller 1386, FIG. 13; DAC 1940, FIG. 19; and reference source 2216 and processor 2286, FIG. 20. Processor 2386, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs).

Processor 2386 can implement processes of various aspects described herein, e.g., processes shown in FIG. 14 or discussed with reference to FIGS. 5, 10-13, 22. Processor 2386 and related components can, e.g., carry out processes for comparing digital or analog values, digitizing analog values, comparing patterns to templates, or training or operating neural networks.

Processor 2386 can be or include one or more device(s) for automatically operating on data, e.g., a central processing unit (CPU), microcontroller (MCU), desktop computer, laptop computer, mainframe computer, personal digital assistant, digital camera, cellular phone, smartphone, or any other device for processing data, managing data, or handling data, whether implemented with electrical, magnetic, optical, biological components, or otherwise.

The phrase "communicatively connected" includes any type of connection, wired or wireless, for communicating data between devices or processors. These devices or processors can be located in physical proximity or not. For example, subsystems such as peripheral system 2320, user interface system 2330, and data storage system 2340 are shown separately from the data processing system 2386 but can be stored completely or partially within the data processing system 2386.

The peripheral system 2320 can include one or more devices configured to provide digital content records to the processor 2386. For example, the peripheral system 2320 can include digital still cameras, digital video cameras, cellular phones, or other data processors. The processor 2386, upon receipt of digital content records from a device in the peripheral system 2320, can store such digital content records in the data storage system 2340.

The user interface system 2330 can convey information in either direction, or in both directions, between a user 2338 and the processor 2386 or other components of system 2301. The user interface system 2330 can include a mouse, a keyboard, another computer (connected, e.g., via a network or a null-modem cable), or any device or combination of devices from which data is input to the processor 2386. The user interface system 2330 also can include a display device, a processor-accessible memory, or any device or combination of devices to which data is output by the processor 2386. The user interface system 2330 and the data storage system 2340 can share a processor-accessible memory.

In various aspects, processor 2386 includes or is connected to communication interface 2315 that is coupled via network link 2316 (shown in phantom) to network 2350. For example, communication interface 2315 can include an integrated services digital network (ISDN) terminal adapter or a modem to communicate data via a telephone line; a network interface to communicate data via a local-area network (LAN), e.g., an Ethernet LAN, or wide-area network (WAN); or a radio to communicate data via a wireless link, e.g., WiFi or GSM. Communication interface 2315 sends and receives electrical, electromagnetic or optical signals that carry digital or analog data streams representing various types of information across network link 2316 to network 2350. Network link 2316 can be connected to network 2350 via a switch, gateway, hub, router, or other networking device.

In various aspects, system 2301 can communicate, e.g., via network 2350, with a data processing system 2302, which can include the same types of components as system 2301 but is not required to be identical thereto. Systems 2301, 2302 are communicatively connected via the network 2350. Each system 2301, 2302 executes computer program instructions to carry out methods or processes noted above.

Processor 2386 can send messages and receive data, including program code, through network 2350, network link 2316 and communication interface 2315. For example, a server can store requested code for an application program (e.g., a JAVA applet) on a tangible non-volatile computer-readable storage medium to which it is connected. The server can retrieve the code from the medium and transmit it through network 2350 to communication interface 2315. The received code can be executed by processor 2386 as it is received, or stored in data storage system 2340 for later execution.

Data storage system 2340 can include or be communicatively connected with one or more processor-accessible memories configured to store information. The memories can be, e.g., within a chassis or as parts of a distributed system. The phrase "processor-accessible memory" is intended to include any data storage device to or from which processor 2386 can transfer data (using appropriate components of peripheral system 2320), whether volatile or nonvolatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs). One of the processor-accessible memories in the data storage system 2340 can be a tangible non-transitory computer-readable storage medium, i.e., a non-transitory device or article of manufacture that participates in storing instructions that can be provided to processor 2386 for execution.

In an example, data storage system 2340 includes code memory 2341, e.g., a RAM, and disk 2343, e.g., a tangible computer-readable rotational storage device such as a hard drive. Computer program instructions are read into code memory 2341 from disk 2343.

Processor 2386 then executes one or more sequences of the computer program instructions loaded into code memory 2341, as a result performing process steps described herein. In this way, processor 2386 carries out a computer implemented process. For example, steps of methods described herein, blocks of the flowchart illustrations or block diagrams herein, and combinations of those, can be implemented by computer program instructions. Code memory 2341 can also store data, or can store only code.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein may be embodied as computer program products including computer readable program code stored on a tangible non-transitory computer readable medium. Such a medium can be manufactured as is conventional for such articles, e.g., by pressing a CD-ROM. The program code includes computer program instructions that can be loaded into processor 2386 (and possibly also other processors), to cause functions, acts, or operational steps of various aspects herein to be performed by the processor 2386 (or other processor). Computer program code for carrying out operations for various aspects described herein may be written in any combination of one or more programming language(s), and can be loaded from disk 2343 into code memory 2341 for execution. The program code may execute, e.g., entirely on processor 2386, partly on processor 2386 and partly on a remote computer connected to network 2350, or entirely on the remote computer.

The invention is inclusive of combinations of the aspects described herein. References to "a particular aspect" (or "embodiment" or "version") and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A system, comprising:
   a plurality of input stages, each configured to successively provide bits of a respective code word, starting with a most-significant bit thereof;
   a plurality of one-shots connected to respective ones of the input stages to successively receive the bits of the respective code words, wherein each one-shot is configured to successively provide a first bit value until receiving a bit having a non-preferred value concurrently with an enable signal, and then to provide a second, different bit value;
   an enable circuit connected to the outputs of the one-shots and configured to provide the enable signal if at least one of the one-shots is providing the first bit value;
   a controller programmed to sequence through a selected number of bits; and
   a plurality of successive-approximation analog-to-digital converters (ADCs), wherein each input stage successively receives the bits from a respective one of the ADCs and each ADC comprises:
      an input terminal;
      a register connected to the respective input stage to successively provide the bits;
      a programmable reference that provides a reference electrical signal in response to the value in the register; and
      a comparator configured to compare an electrical signal at the input terminal to the reference electrical signal and adjust a bit in the register indicated by the controller, wherein the comparator comprises:
         a domain-wall neuron connected to the input terminal and the programmable reference; and
         a CMOS latch configured to compare an output of the domain-wall neuron with a selected threshold and store a bit value according to the result of the comparison.

2. The system according to claim 1, wherein the programmable reference comprises a binary-weighted transistor digital-to-analog converter (DAC) responsive to the value in the register to provide the reference electrical signal.

3. The system according to claim 1, further comprising:
   a crossbar array having a plurality of row electrodes, a plurality of column electrodes, and a plurality of resistive memory elements, each memory element directly connected to one of the row electrodes and one of the column electrodes; and
   a signal source configured to apply a plurality of test electrical signals to respective ones of the row electrodes;
   wherein the column electrodes are electrically connected to the input terminals of the respective ADCs.

4. The system according to claim 3, further comprising a writing circuit configured to store selected values in the resistive memory elements.

5. The system according to claim 4, further comprising a controller configured to:
   receive an input vector and a plurality of test vectors;
   operate the writing circuit to store values from each of the test vectors in the resistive memory elements directly connected to a respective one of the column electrodes;
   operate the signal source to apply the test electrical signals corresponding to the input vector; and
   determine which one(s) of the test vectors satisfy a selected criterion with respect to the input vector using the outputs of the one-shots.

6. A system, comprising:
   a crossbar array having a plurality of row electrodes, a plurality of column electrodes, and a plurality of resistive memory elements, each memory element directly connected to one of the row electrodes and one of the column electrodes and configured to store an analog weight;
   a writing circuit configured to store selected weights in the resistive memory elements, the writing circuit configured to determine at least one of a pulse width of a programming pulse or a current of the programming pulse, wherein the at least one of the pulse width or the current is determined based at least in part on a respective weight of the selected weights;
   a signal source configured to apply a plurality of test electrical signals to respective ones of the row electrodes;
   a plurality of comparators, each configured to compare an electrical signal on a respective one of the column electrodes to a corresponding reference electrical signal and to provide a corresponding bit value according to a result of the electrical signal comparison;
   a plurality of input stages, each input stage comprising one of the plurality of comparators and configured to successively provide bits of a respective code word, starting with a most-significant bit thereof;
   a plurality of one-shots connected to respective ones of the input stages to successively receive the bits of the respective code words, wherein each one-shot is configured to successively provide a first bit value until receiving a bit having a non-preferred value concurrently with an enable signal, and then to provide a second, different bit value; and an enable circuit connected to the outputs of the one-shots and configured to provide the enable signal if at least one of the one-shots is providing the first bit value.

7. The system according to claim 6, further comprising a processor configured to:
operate a neural-network training algorithm to determine updated weights based at least in part on the selected weights, the test electrical signals, and the respective bit values of the comparators, and
cause the writing circuit to store the updated weights in the resistive memory elements.

8. The system according to claim 6, further comprising a reference source configured to provide the reference electrical signal(s) corresponding to one or more of the comparators.

9. The system according to claim 8, wherein:
the reference source comprises:
a controller programmed to sequence through a selected number of bits, starting with a most-significant bit of the selected number of bits; and
a plurality of reference circuits, each configured to provide one of the reference electrical signal(s) to a respective one of the comparators;
each reference circuit comprises:
a register configured to hold respective values for the selected number of bits; and
a signal generator that provides the respective one of the reference electrical signals in response to the values in the register; and
the controller is configured to successively update the bits of each of the registers in the sequence according to the stored bit value in the respective one of the comparators.

10. The system according to claim 9, wherein each signal generator comprises a binary-weighted transistor digital-to-analog converter (DAC) responsive to the values in the respective register to provide the respective one of the reference electrical signals.

11. The system according to claim 9, further comprising a processor configured to receive the respective bit values in the registers, determine updated weights using the selected weights, the test electrical signals, and the received bit values, and cause the writing circuit to store the updated weights in the resistive memory elements.

12. The system according to claim 8, wherein each comparator of the plurality of comparators comprises:
a domain-wall neuron connected to the respective column electrode and to the reference source; and
a CMOS latch configured to compare an output of the domain-wall neuron with a selected threshold and to store the bit value according to a result of the threshold comparison.

13. The system according to claim 6, wherein the enable circuit comprises:
a node selectively carrying the enable signal;
a precharge circuit configured to precharge the node to a signal level different from the enable signal; and
a modification circuit configured to provide the enable signal on the node in response to the first bit value from at least one of the one-shots.

14. The system according to claim 13, wherein:
the precharge circuit comprises a pullup;
the discharge circuit comprises respective selective pulldowns controlled by the outputs of respective ones of the one-shots;
the enable signal corresponds to a low signal level of the node; and
the signal level different from the enable signal corresponds to a high signal level of the node.

15. A system, comprising:
a crossbar array having a plurality of row electrodes, a plurality of column electrodes, and a plurality of resistive memory elements, each memory element directly connected to one of the row electrodes and one of the column electrodes and configured to store an analog weight;
a writing circuit configured to store selected weights in the resistive memory elements, the writing circuit configured to determine at least one of a pulse width of a programming pulse or a current of the programming pulse, wherein the at least one of the pulse width or the current is determined based at least in part on a respective weight of the selected weights;
a signal source configured to apply a plurality of test electrical signals to respective ones of the row electrodes;
a plurality of comparators, each configured to compare an electrical signal on a respective one of the column electrodes to a corresponding reference electrical signal and to provide a corresponding bit value according to a result of the electrical signal comparison; and
a reference source configured to provide the reference electrical signal(s) corresponding to one or more of the comparators, wherein:
the reference source comprises:
a controller programmed to sequence through a selected number of bits, starting with a most-significant bit of the selected number of bits; and
a plurality of reference circuits, each configured to provide one of the reference electrical signal(s) to a respective one of the comparators;
each reference circuit comprises:
a register configured to hold respective values for the selected number of bits; and
a signal generator that provides the respective one of the reference electrical signals in response to the values in the register; and
the controller is configured to successively update the bits of each of the registers in the sequence according to the stored bit value in the respective one of the comparators.

16. The system according to claim 15, further comprising a processor configured to:
operate a neural-network training algorithm to determine updated weights based at least in part on the selected weights, the test electrical signals, and the respective bit values of the comparators, and
cause the writing circuit to store the updated weights in the resistive memory elements.

17. The system according to claim 15, wherein each signal generator comprises a binary-weighted transistor digital-to-analog converter (DAC) responsive to the values in the respective register to provide the respective one of the reference electrical signals.

18. The system according to claim 15, further comprising a processor configured to receive the respective bit values in the registers, determine updated weights using the selected weights, the test electrical signals, and the received bit values, and cause the writing circuit to store the updated weights in the resistive memory elements.

19. The system according to claim 15, further comprising a reference source configured to provide the reference electrical signal(s) corresponding to one or more of the comparators.

20. The system according to claim 19, wherein each comparator of the plurality of comparators comprises:
- a domain-wall neuron connected to the respective column electrode and to the reference source; and
- a CMOS latch configured to compare an output of the domain-wall neuron with a selected threshold and to store the bit value according to a result of the threshold comparison.

* * * * *